(12) United States Patent
Inoue et al.

(10) Patent No.: US 11,094,833 B2
(45) Date of Patent: Aug. 17, 2021

(54) SEMICONDUCTOR DEVICE INCLUDING MEMORY USING HAFNIUM AND A METHOD OF MANUFACTURING THE SAME

(71) Applicant: RENESAS ELECTRONICS CORPORATION, Tokyo (JP)

(72) Inventors: Masao Inoue, Tokyo (JP); Masaru Kadoshima, Tokyo (JP); Yoshiyuki Kawashima, Tokyo (JP); Ichiro Yamakawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/452,261

(22) Filed: Jun. 25, 2019

(65) Prior Publication Data
US 2020/0027996 A1 Jan. 23, 2020

(30) Foreign Application Priority Data
Jul. 17, 2018 (JP) .............................. JP2018-134089

(51) Int. Cl.
*H01L 29/792* (2006.01)
*H01L 29/423* (2006.01)
(Continued)

(52) U.S. Cl.
CPC ...... *H01L 29/792* (2013.01); *H01L 21/02148* (2013.01); *H01L 21/02178* (2013.01);
(Continued)

(58) Field of Classification Search
CPC ......... H01L 21/02148; H01L 21/02178; H01L 27/11563; H01L 29/408; H01L 29/4234;
(Continued)

(56) References Cited

U.S. PATENT DOCUMENTS 6,706,599 B1 * 3/2004 Sadd ..................... B82Y 10/00
438/261
6,885,060 B2 * 4/2005 Nomoto ................ H01L 27/115
257/324

(Continued)

FOREIGN PATENT DOCUMENTS

JP      2011054843 A  *  3/2011    ............. H01L 29/78
JP      2015-053474 A    3/2015

OTHER PUBLICATIONS

Machine translation, Mihashi, Japanese Patent Pub. No. JP 2011-054843, translation date: Jul. 16, 2020, Espacenet, all pages (Year: 2020).*

*Primary Examiner* — Victoria K. Hall
(74) *Attorney, Agent, or Firm* — McDermott Will & Emery LLP

(57) ABSTRACT

A memory cell, which is a nonvolatile memory cell, includes a gate dielectric film having charge storage layer capable of holding charges, and a memory gate electrode formed on the gate dielectric film. The charge storage layer includes an insulating film containing hafnium, silicon, and oxygen, an insertion layer formed on the insulating film and containing aluminum, and an insulating film formed on the insertion layer and containing hafnium, silicon, and oxygen.

13 Claims, 30 Drawing Sheets

(51) Int. Cl.
  *H01L 29/51*    (2006.01)
  *H01L 21/28*    (2006.01)
  *H01L 21/02*    (2006.01)
  *H01L 29/66*    (2006.01)
(52) U.S. Cl.
  CPC .. *H01L 21/02356* (2013.01); *H01L 29/40117* (2019.08); *H01L 29/4234* (2013.01); *H01L 29/42364* (2013.01); *H01L 29/513* (2013.01); *H01L 29/517* (2013.01); *H01L 29/66833* (2013.01)
(58) Field of Classification Search
  CPC ............. H01L 29/66833; H01L 29/792; H01L 21/02145; H01L 2924/01072; H01L 2924/01013
  See application file for complete search history.

(56) References Cited

U.S. PATENT DOCUMENTS

| | | | | |
|---|---|---|---|---|
| 7,034,356 B2 * | 4/2006 | Nomoto | H01L 27/115 | 257/324 |
| 7,098,502 B2 * | 8/2006 | Mathew | B82Y 10/00 | 257/308 |
| 7,135,421 B2 * | 11/2006 | Ahn | H01L 21/28176 | 438/785 |
| 7,265,409 B2 * | 9/2007 | Kobayashi | H01L 29/1033 | 257/314 |
| 7,402,534 B2 * | 7/2008 | Mahajani | C23C 16/0218 | 438/785 |
| 7,659,158 B2 * | 2/2010 | Ma | H01L 29/7881 | 438/201 |
| 8,125,015 B2 * | 2/2012 | Lee | H01L 27/11521 | 257/314 |
| 8,323,754 B2 * | 12/2012 | Olsen | H01L 21/31645 | 427/578 |
| 8,482,053 B2 * | 7/2013 | Takashima | H01L 21/02156 | 257/324 |
| 8,513,725 B2 * | 8/2013 | Sakuma | H01L 29/785 | 257/314 |
| 8,581,328 B2 * | 11/2013 | Okuyama | H01L 27/11568 | 257/324 |
| 8,629,489 B2 * | 1/2014 | Lee | H01L 27/1052 | 257/314 |
| 8,779,498 B2 * | 7/2014 | Takashima | H01L 27/11568 | 257/316 |
| 8,896,052 B2 * | 11/2014 | Morota | H01L 29/518 | 257/324 |
| 8,953,380 B1 * | 2/2015 | Yu | G11C 16/10 | 365/185.18 |
| 9,685,565 B2 | 6/2017 | Mizutani et al. | | |
| 2002/0137288 A1 * | 9/2002 | Nomoto | H01L 27/115 | 438/261 |
| 2003/0235961 A1 * | 12/2003 | Metzner | H01L 21/31612 | 438/287 |
| 2005/0199945 A1 * | 9/2005 | Kodama | H01L 29/7845 | 257/324 |
| 2006/0220098 A1 * | 10/2006 | Lee | H01L 27/11521 | 257/315 |
| 2007/0029625 A1 * | 2/2007 | Lue | H01L 29/513 | 257/411 |
| 2007/0066014 A1 * | 3/2007 | Park | H01L 27/115 | 438/257 |
| 2007/0170502 A1 * | 7/2007 | Koji | H01L 21/022 | 257/347 |
| 2007/0284652 A1 * | 12/2007 | Kobayashi | H01L 29/40117 | 257/324 |
| 2008/0093648 A1 * | 4/2008 | Oh | H01L 27/115 | 257/315 |
| 2008/0105918 A1 * | 5/2008 | Jeon | H01L 27/11546 | 257/324 |
| 2008/0182375 A1 * | 7/2008 | Rao | H01L 29/7923 | 438/267 |
| 2008/0237688 A1 * | 10/2008 | Yasuda | H01L 29/513 | 257/316 |
| 2008/0237700 A1 * | 10/2008 | Kim | H01L 27/11573 | 257/326 |
| 2008/0265342 A1 * | 10/2008 | Chang | H01L 29/42348 | 257/411 |
| 2009/0001449 A1 * | 1/2009 | Toba | H01L 27/11568 | 257/324 |
| 2009/0008698 A1 * | 1/2009 | Lee | H01L 29/7881 | 257/321 |
| 2009/0014781 A1 * | 1/2009 | Baik | H01L 29/40117 | 257/324 |
| 2009/0014809 A1 * | 1/2009 | Sekine | H01L 21/28097 | 257/369 |
| 2009/0014844 A1 * | 1/2009 | Lee | H01L 24/32 | 257/628 |
| 2009/0057750 A1 * | 3/2009 | Takashima | H01L 29/42324 | 257/321 |
| 2009/0085096 A1 * | 4/2009 | Park | H01L 27/11573 | 257/324 |
| 2009/0085160 A1 * | 4/2009 | Lee | H01L 29/40117 | 257/532 |
| 2009/0086549 A1 * | 4/2009 | Fujiki | G11C 16/0483 | 365/185.28 |
| 2009/0095995 A1 * | 4/2009 | Kawashima | H01L 27/11526 | 257/296 |
| 2009/0114996 A1 * | 5/2009 | Inumiya | H01L 21/02192 | 257/369 |
| 2009/0127611 A1 * | 5/2009 | Park | H01L 29/4234 | 257/316 |
| 2009/0134450 A1 * | 5/2009 | Kim | H01L 29/40114 | 257/325 |
| 2009/0242963 A1 * | 10/2009 | Shingu | H01L 21/31604 | 257/324 |
| 2009/0309154 A1 * | 12/2009 | Cho | H01L 27/11524 | 257/324 |
| 2009/0321810 A1 * | 12/2009 | Ryu | H01L 29/513 | 257/321 |
| 2010/0025754 A1 * | 2/2010 | Shiba | H01L 27/11568 | 257/326 |
| 2010/0080062 A1 * | 4/2010 | Fujiki | H01L 27/11565 | 365/185.18 |
| 2010/0128531 A1 * | 5/2010 | Lee | G11C 16/0466 | 365/185.05 |
| 2010/0173485 A1 * | 7/2010 | Lee | H01L 27/11565 | 438/586 |
| 2010/0244120 A1 * | 9/2010 | Kang | B82Y 10/00 | 257/325 |
| 2010/0244121 A1 * | 9/2010 | Loiko, V | B82Y 10/00 | 257/325 |
| 2010/0248465 A1 * | 9/2010 | Yi | H01L 21/3185 | 438/591 |
| 2010/0248466 A1 * | 9/2010 | Loiko, V | H01L 29/42328 | 438/593 |
| 2010/0317169 A1 * | 12/2010 | Sung | H01L 29/66825 | 438/287 |
| 2011/0001183 A1 * | 1/2011 | Yoo | H01L 27/11521 | 257/324 |
| 2011/0006357 A1 * | 1/2011 | Tsuji | H01L 29/66833 | 257/324 |
| 2011/0188307 A1 * | 8/2011 | Kito | H01L 27/11582 | 365/185.02 |
| 2011/0188321 A1 * | 8/2011 | Kito | H01L 29/792 | 365/185.29 |
| 2011/0233610 A1 * | 9/2011 | Oho | H01L 27/11521 | 257/192 |
| 2011/0233631 A1 * | 9/2011 | Son | H01L 27/11578 | 257/298 |
| 2011/0286275 A1 * | 11/2011 | Jeon | H01L 27/11556 | 365/185.17 |
| 2011/0287612 A1 * | 11/2011 | Lee | H01L 27/11578 | 438/478 |
| 2011/0298013 A1 * | 12/2011 | Hwang | H01L 27/088 | 257/208 |
| 2011/0298037 A1 * | 12/2011 | Choe | H01L 27/11556 | 257/324 |

(56) References Cited

U.S. PATENT DOCUMENTS

| | | | |
|---|---|---|---|
| 2012/0001264 A1* | 1/2012 | Kim | H01L 27/11582 257/368 |
| 2012/0052676 A1* | 3/2012 | Lee | H01L 27/11526 438/594 |
| 2012/0068241 A1* | 3/2012 | Sakuma | H01L 27/11551 257/314 |
| 2012/0068253 A1* | 3/2012 | Oota | H01L 27/11578 257/324 |
| 2012/0068254 A1* | 3/2012 | Sakuma | H01L 29/792 257/324 |
| 2012/0069679 A1* | 3/2012 | Fujiki | G11C 16/3459 365/185.23 |
| 2012/0195128 A1* | 8/2012 | Fujiwara | G11C 11/5628 365/185.24 |
| 2012/0206961 A1* | 8/2012 | Kito | G11C 16/06 365/185.2 |
| 2012/0228697 A1* | 9/2012 | Youm | H01L 27/11556 257/329 |
| 2012/0273747 A1* | 11/2012 | Saitoh | H01L 21/823431 257/5 |
| 2012/0276696 A1* | 11/2012 | Yang | H01L 27/11582 438/156 |
| 2012/0276702 A1* | 11/2012 | Yang | H01L 29/66765 438/270 |
| 2012/0280304 A1* | 11/2012 | Lee | H01L 29/7889 257/316 |
| 2013/0015519 A1* | 1/2013 | Fujii | H01L 27/11521 257/324 |
| 2013/0015520 A1* | 1/2013 | Shosuke | H01L 27/11578 257/324 |
| 2013/0089974 A1* | 4/2013 | Lee | H01L 27/11556 438/510 |
| 2013/0134372 A1* | 5/2013 | Sakuma | H01L 21/265 257/1 |
| 2013/0175490 A1* | 7/2013 | Kusai | H01L 29/685 257/1 |
| 2013/0181184 A1* | 7/2013 | Sakuma | H01L 27/11519 257/5 |
| 2013/0200450 A1* | 8/2013 | Kusai | H01L 29/66833 257/324 |
| 2013/0307047 A1* | 11/2013 | Sakuma | H01L 27/1157 257/316 |
| 2014/0061763 A1* | 3/2014 | Morota | H01L 29/66833 257/324 |
| 2014/0179121 A1* | 6/2014 | Ikegawa | H01L 21/02194 438/782 |
| 2014/0264535 A1* | 9/2014 | Sasaki | H01L 29/66833 257/316 |
| 2014/0273372 A1* | 9/2014 | Sakuma | H01L 29/7926 438/268 |
| 2015/0008501 A1* | 1/2015 | Sakuma | H01L 27/11582 257/316 |
| 2015/0060991 A1* | 3/2015 | Mizutani | H01L 21/02148 257/324 |
| 2015/0132915 A1* | 5/2015 | Park | H01L 27/11582 438/287 |
| 2015/0137205 A1* | 5/2015 | Kim | H01L 29/7926 257/314 |
| 2015/0228663 A1* | 8/2015 | Youn | H01L 21/76879 438/268 |
| 2015/0255479 A1* | 9/2015 | Sakuma | H01L 21/02255 257/316 |
| 2015/0318293 A1* | 11/2015 | Lee | H01L 27/11529 257/392 |
| 2015/0349143 A1* | 12/2015 | Inoue | H01L 29/518 257/324 |
| 2015/0372000 A1* | 12/2015 | Jee | H01L 27/11521 257/314 |
| 2016/0043179 A1* | 2/2016 | Noh | H01L 27/11582 257/315 |
| 2016/0056169 A1* | 2/2016 | Lee | H01L 27/11578 438/269 |
| 2016/0064227 A1* | 3/2016 | Go | H01L 27/11556 438/585 |
| 2016/0071877 A1* | 3/2016 | Kim | H01L 27/11526 257/314 |
| 2016/0093631 A1* | 3/2016 | Yun | H01L 27/11582 257/314 |
| 2016/0358927 A1* | 12/2016 | Nam | H01L 27/11582 |
| 2017/0033118 A1* | 2/2017 | Fujii | H01L 27/11565 |
| 2017/0062468 A1* | 3/2017 | Son | H01L 27/1157 |
| 2017/0077112 A1* | 3/2017 | Murakoshi | H01L 29/40117 |
| 2017/0077137 A1* | 3/2017 | Kim | H01L 27/11582 |
| 2017/0186767 A1* | 6/2017 | Baek | H01L 27/11575 |
| 2017/0301685 A1* | 10/2017 | Dorhout | H01L 27/1157 |
| 2017/0309635 A1* | 10/2017 | Kim | H01L 27/0688 |
| 2018/0019257 A1* | 1/2018 | Son | H01L 27/11582 |
| 2018/0026046 A1* | 1/2018 | Nam | H01L 27/1157 257/314 |
| 2018/0026047 A1* | 1/2018 | Park | H01L 27/11575 257/314 |
| 2018/0090313 A1* | 3/2018 | Chung | H01L 21/0217 |
| 2018/0211842 A1* | 7/2018 | Chung | H01L 21/02211 |
| 2019/0148562 A1* | 5/2019 | Inoue | H01L 29/4234 257/324 |
| 2019/0326311 A1* | 10/2019 | Chakihara | H01L 22/12 |

* cited by examiner

FIG. 3

| APPLIED VOLTAGE / OPERATION | Vd | Vmg | Vs | Vb |
|---|---|---|---|---|
| WRITE | −6V | Vcc | −6V | −6V |
| ERASE | Vcc | −6V | Vcc | Vcc |
| READ | Vcc | Vcc | 0V | 0V |

Vcc = 1.5V

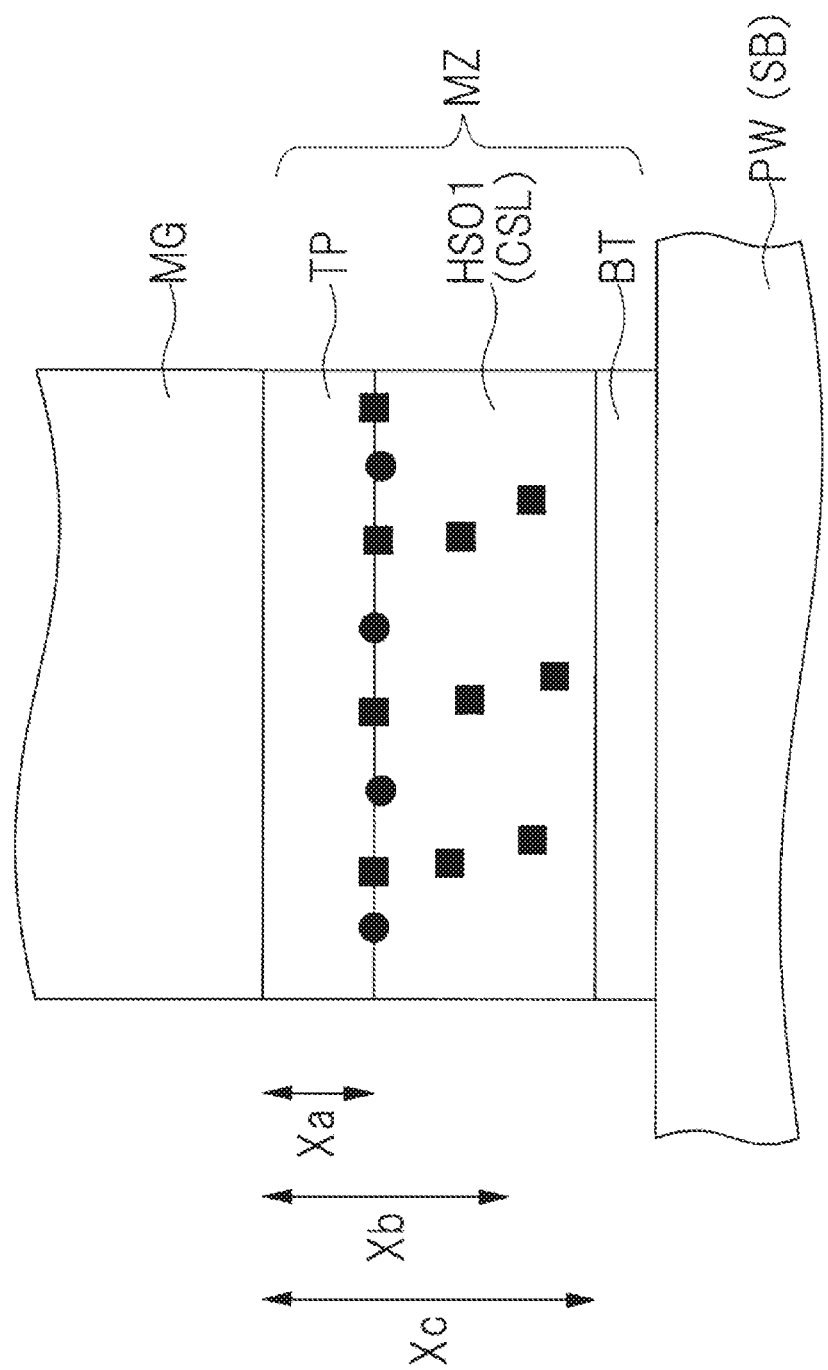

FIG. 19

| APPLIED VOLTAGE  OPERATION | Vd | Vcg | Vmg | Vs | Vb |
|---|---|---|---|---|---|
| WRITE | 0.5V | 1V | 7V | 3.5V | 0V |
| ERASE | 0V | 0V | -5V | 5V | 0V |
| READ | Vcc | Vcc | 0V | 0V | 0V |

Vcc = 1.5V

SEMICONDUCTOR DEVICE INCLUDING MEMORY USING HAFNIUM AND A METHOD OF MANUFACTURING THE SAME

CROSS-REFERENCE TO RELATED APPLICATIONS

The disclosure of Japanese Patent Application No. 2018-134089 filed on Jul. 17, 2018 including the specification, drawings and abstract is incorporated herein by reference in its entirety.

BACKGROUND

The present invention relates to a semiconductor device and a method of manufacturing the same, and more particularly, the present invention relates to a technique useful for a semiconductor device having a nonvolatile memory cell.

A flash memory or an Electrically Erasable and Programmable Read Only Memory (EEPROM) are widely used as an electrically programmable and erasable nonvolatile memory. The nonvolatile memory cell includes a memory cell called a Metal Oxide Nitride Oxide Semiconductor (MONOS) type transistor in which a charge storage layer having a trapping insulating film such as a silicon nitride film is provided below a gate electrode. By injecting and discharging charges into and from the charge storage layer, the threshold of the transistor is shifted, thereby enabling the transistor to be used as a nonvolatile memory cell. In recent years, a nonvolatile memory cell using a high dielectric constant film such as a hafnium oxide film instead of a silicon nitride film as a charge storage layer has been developed.

For example, Japanese unexamined Patent Application publication No. 2015/53474 discloses a nonvolatile memory cell using a hafnium silicate film as the charge storage layer.

SUMMARY

In a nonvolatile memory cell using a high dielectric constant film, it is desired to improve reliability such as retention characteristics.

Other objects and novel features will be apparent from the description of the specification and the accompanying drawings.

The typical ones of the embodiments disclosed in the present application will be briefly described as follows.

A semiconductor device according to embodiments includes a nonvolatile memory cell having a first gate dielectric film formed on a semiconductor substrate and including a charge storage layer capable of holding charges, and a first gate electrode formed on the first gate dielectric film. Here, the charge storage layer includes a first insulating film containing hafnium, silicon, and oxygen, a first insertion layer formed on the first insulating film and made of a material different from that of the first insulating film and containing aluminum, and a second insulating film formed on the first insertion layer and made of a material different from that of the first insertion layer and containing hafnium, silicon, and oxygen.

In addition, a semiconductor device according to embodiments includes a nonvolatile memory cell having a charge storage layer capable of holding charges. Here, the charge storage layer has a first insulating layer containing hafnium, silicon, and oxygen. At least one insertion layer containing a metal different from hafnium is formed in the first insulating film.

According to embodiments, the reliability of the semiconductor device can be improved.

BRIEF DESCRIPTION OF THE DRAWINGS

FIG. 3 is a table showing an example of a condition for applying a voltage to each part of a selected memory cell during "write", "erase" and "read".

FIG. 6 is a schematic diagram showing the trapping levels that exist within a charge storage layer.

FIG. 19 is a table showing an example of a condition for applying a voltage to each part of a selected memory cell during "write", "erase" and "read".

DETAILED DESCRIPTION

Figure 1:
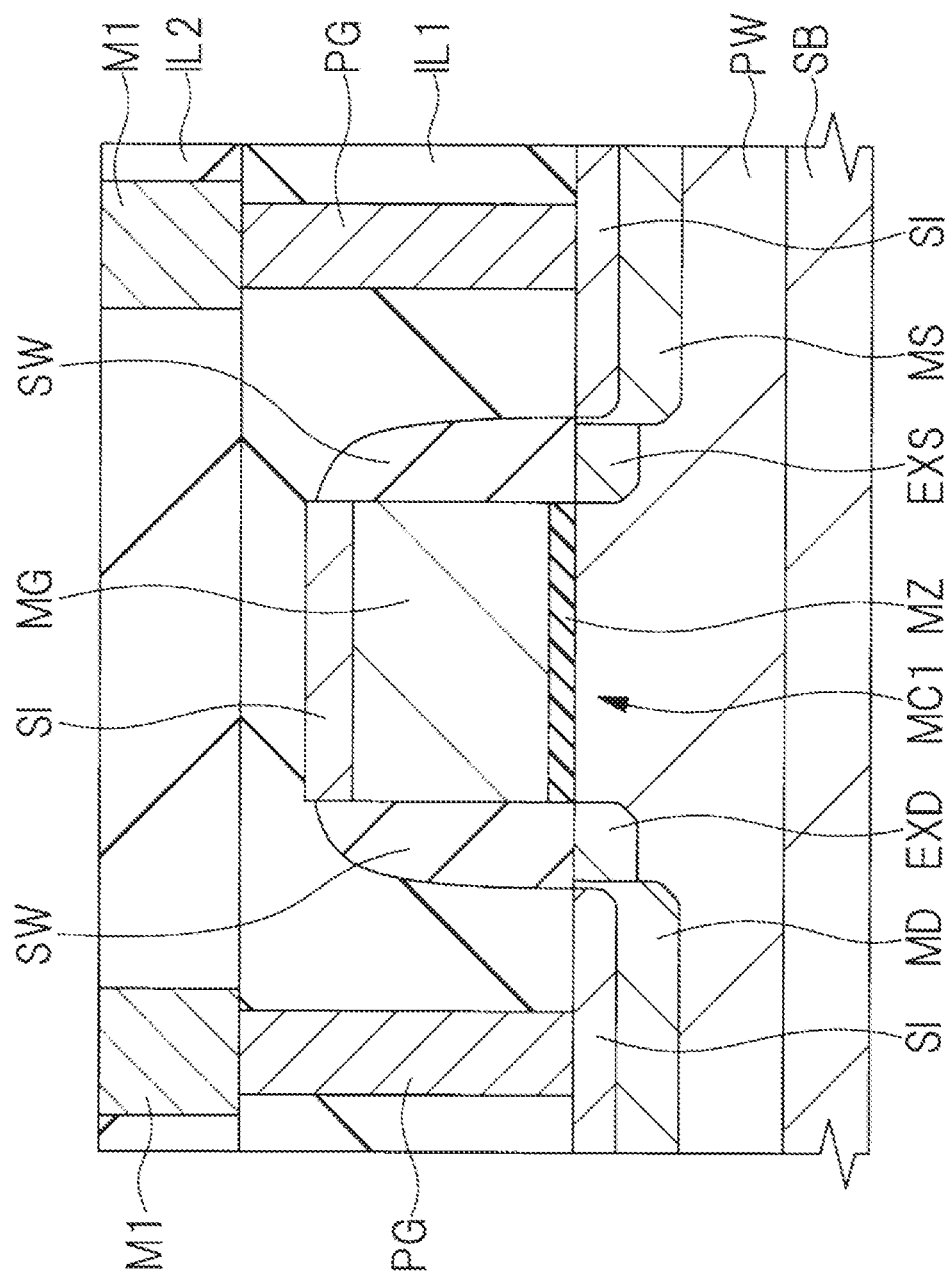
FIG. 1 is a cross sectional view showing a semiconductor device of first embodiment.

In the following embodiments, when required for convenience, the description will be divided into a plurality of sections or embodiments, but except when specifically stated, these sections are not independent of each other, and one is related to the modification, information, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted in order to make the drawings easier to see.

First Embodiment

Figure 2:
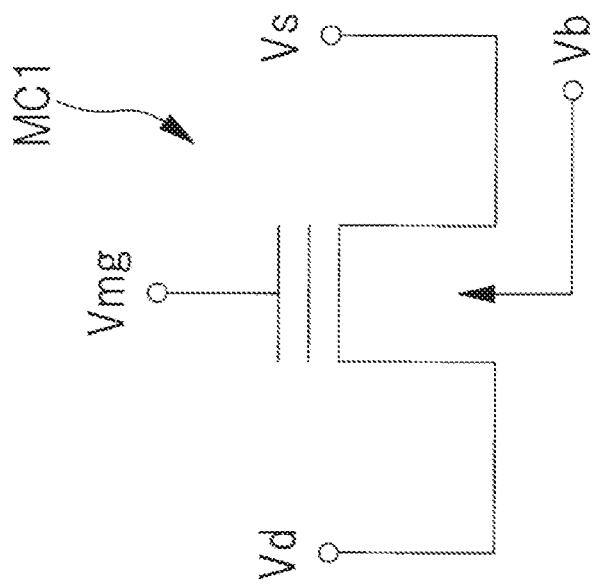
FIG. 2 is an equivalent circuit diagram of a memory cell of first embodiment.

A semiconductor device comprising a memory cell MC1 that is a nonvolatile memory cell in a present embodiment will be described with reference to the drawings. FIG. 1 is a cross sectional view of the semiconductor device of present embodiment, and FIG. 2 is an equivalent circuit diagram of a memory cell of FIG. 1.

The memory cell MC1 of the present embodiment is an n-type transistor including a charge storage layer CSL capable of holding charges in the gate dielectric film MZ, and the charge storage layer CSL includes a trapping insulating film.

As shown in FIG. 1, a p-type well region PW is formed in the semiconductor substrate SB, and a memory cell MC1 is formed on the well region PW. The semiconductor substrate SB is made of p-type monocrystalline silicon (Si) having a resistivity of, for example, 1 Ωcm to 10 Ωcm.

A gate dielectric film MZ is formed on the semiconductor substrate SB (i.e., on the well area PW1), and memory gate electrode MG is formed on the gate dielectric film MZ. The memory gate electrode MG is, for example, a conductive film such as a polycrystalline silicon film into which an n-type impurity is introduced. Note that a polycrystalline silicon film into which a p-type impurity is introduced or a polycrystalline silicon film into which no impurity is introduced may be used for the memory gate electrode MG in order to secure a hole tunneling current at the time of erasing. The memory gate electrode MG may be, for example, a metal film such as a titanium nitride film, an aluminum film, or a tungsten film, or a stacked film of these metal films.

In FIG. 1, the gate dielectric film MZ is shown as a single-layer insulating film for the drawing easier to see, but in reality, as will be described later with reference to FIG. 4, the gate dielectric film MZ is a multilayer film having an insulating film BT, an insulating film HSO1, an insertion layer AL1, an insulating film HSO2, and an insulating film TP.

Sidewall spacers SW are formed on the side surfaces of the memory gate electrode MG. The sidewall spacer SW is formed of, for example, a stacked film of a silicon oxide film and a silicon nitride film.

An extension region EXS and an extension region EXD, which are low-concentration n-type impurity regions, are formed in the well region PW under the sidewall spacers SW. In the well region PW at a position aligned the sidewall spacer SW, a diffusion region MS which is an n-type impurity region having a higher concentration than the extension region EXS and a diffusion region MD which is an n-type impurity region having a higher concentration than the extension region EXD are formed. The extension region EXS and the diffusion region MS are connected to each other, and each constitutes a part of a source region of the memory cell MC1. The extension region EXD and the diffusion region MD are connected to each other, and each constitutes a part of the drain region of the memory cell MC1.

Silicide layers SI are formed, for example, of cobalt silicide (CoSi2), nickel silicide (NiSi) or nickel platinum silicide (NiPtSi), on the memory gate electrode MG, on the diffusion region MS and on the diffusion region MD. The silicide layer SI is mainly formed to reduce contact resistance with the plug PG, which will be described later.

An interlayer insulating film IL1 is formed on the memory cell MC1. A plurality of contact holes are formed in the interlayer insulating film Ill, and a plurality of plugs PG are formed in the plurality of contact holes. The plug PG is formed of, for example, a barrier metal film formed of a titanium film, a titanium nitride film, or a stacked film thereof, and a conductive film mainly made of, for example, tungsten. The plug PG is electrically connected to the diffusion region MS or the diffusion region MD via the silicide layer SI. Although not shown, a plug PG electrically connected to the memory gate electrode MG also exists in the interlayer insulating film IL1.

An interlayer insulating film IL2 is formed on the plugs PG and the interlayer insulating film IL1. Trenches for wirings are formed in the interlayer insulating film IL2, and wirings M1 having conductive films mainly made of copper, for example, are buried in the trenches. The wirings M1 are electrically connected to the plugs PG. Such wirings are so-called damascene-structured wirings. A multilayered wiring and an interlayer insulating film are also formed above the wirings M1, but illustration and explanation thereof are omitted here.

Operation of Memory Cell MC1

Referring to FIGS. 2 and 3, an exemplary operation of a memory cell MC1, which is a nonvolatile memory cell, will be described below. The memory cell MC1 described here is a selected memory cell among a plurality of memory cells MC1 existing in the semiconductor device.

FIG. 2 is an equivalent circuit diagram of the memory cell MC1. FIG. 3 is a table showing examples of conditions for applying voltages to the respective portions of the memory cell MC1 at the time of "write", "erase" and "read". In the table of FIG. 3, a voltage Vd applied to a diffusion region MD as a drain region, a voltage Vmg applied to a memory gate electrode MG, a voltage Vs applied to a diffusion region MS as a source region, and a voltage Vb applied to a well region PW are described at the time of each of "write", "erase", and "read".

Note that what is shown in the table of FIG. 3 is a suitable example of a voltage application condition, and is not limited to this, and various changes can be made as necessary. In present embodiment, injecting electrons from the well region PW into the charge storage layer CSL is defined as "write", and emitting electrons from the charge storage layer CSL into the well region PW is defined as "erase".

The write operation is performed by the Fowler Nordheim Tunneling (FN-tunneling) method. For example, voltages as shown in the column of "write" in FIG. 3 are applied to the respective portions of the memory cell MC1 to be written, and electrons are injected from the well region PW into the charge storage layer CSL of the memory cell MC1 to perform writing. The injected electrons are captured in the trapping levels in the charge storage layer CSL, and as a result, the threshold voltage of the memory transistor having the memory gate electrode MG rise. That is, the memory transistor is in the write state.

The erase operation is performed by the FN-tunneling method. For example, voltages as shown in the column of "erase" in FIG. 3 are applied to the respective portions of the memory cell MC1 to be erased, and electrons in the charge storage layer CSL are emitted to the well region PW. As a result, the threshold voltage of the memory transistor is lowered. That is, the memory transistor is in the erase state.

In the read operation, for example, voltages as shown in the column of "read" in FIG. 3 are applied to the respective portions of the memory cell MC1 to be read. By setting the voltage Vmg applied to the memory gate electrode MG at the time of reading to a value between the threshold voltage of the memory transistor in the write state and the threshold voltage of the memory transistor in the erase state, the write state or the erase state can be discriminated.

Detailed Structure of Gate Dielectric Film MZ

Figure 4:
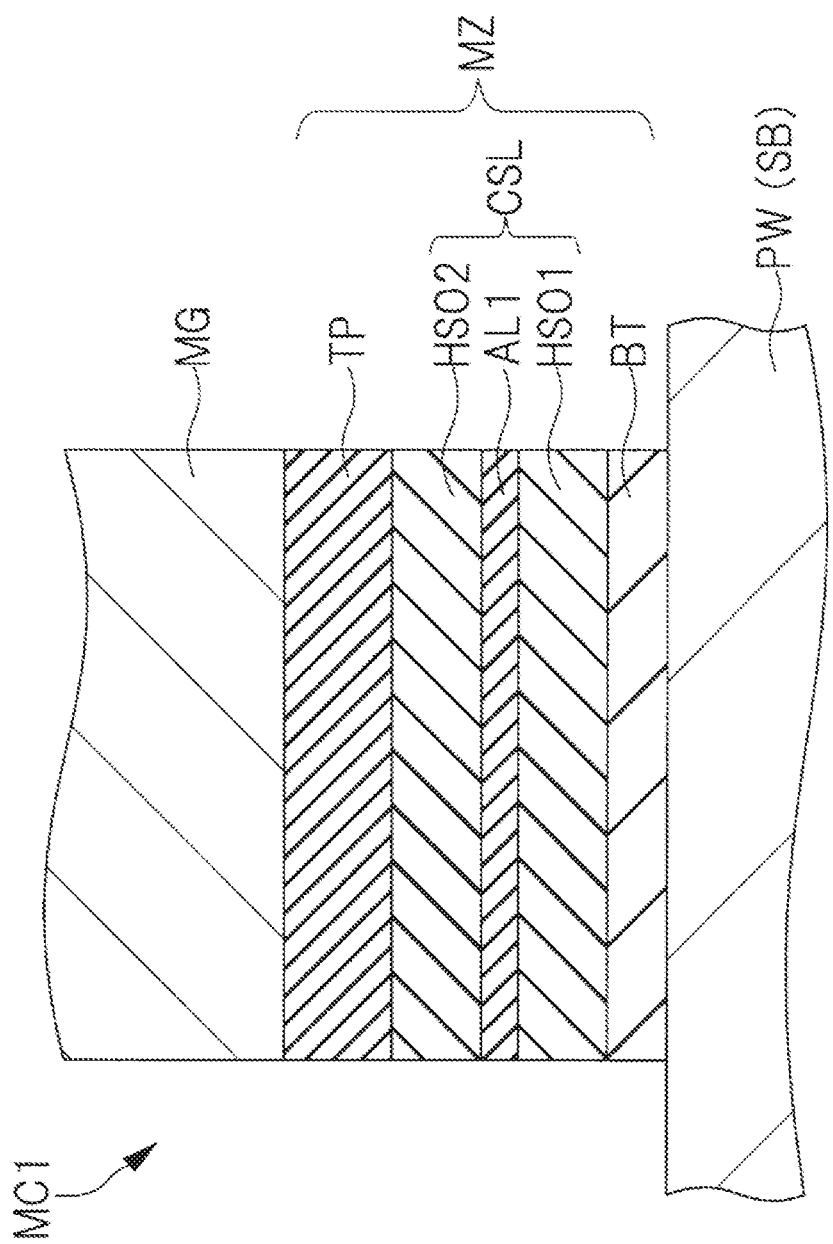
FIG. 4 is an enlarged cross sectional view of the main portion of a semiconductor device of first embodiment.

FIG. 4 is an enlarged cross sectional view of the main portion of the semiconductor device shown in FIG. 1, and is a cross sectional view showing the detailed structure of the gate dielectric film MZ.

The gate dielectric film MZ is interposed between the semiconductor substrate SB (well area PW) and the memory gate electrode MG, functions as a gate dielectric film of the memory cell MC1, and is a stacked film having the charge storage layer CSL therein. Specifically, the gate dielectric film MZ is formed of a stacked film of an insulating film BT formed on the semiconductor substrate SB, an insulating film HSO1 formed on the insulating film BT, an insertion layer AL1 formed on the insulating film HSO1, an insulating film HSO2 formed on the insertion layer AL1, and an insulating film TP formed on the insulating film HSO2.

The insulating film (bottom insulating film) BT is, for example, a silicon oxide film or a silicon oxynitride film, and has a thickness of, for example, 2 nm to 5 nm.

The insulating film HSO1 is a film having a dielectric constant greater than that of the silicon nitride film, and is a metal oxide film, and has a thickness of, for example, 5 nm to 9 nm. Specifically, the insulating film HSO1 is a film containing hafnium (Hf), silicon (Si), and oxygen (O), and is preferably a hafnium silicate film such as an $Hf_xSi_{1-x}O_2$ ($0<x<1$) film. In order to improve the density of trapping levels in the insulating film HSO1, the composition ratio of the $Hf_xSi_{1-x}O_2$ film is preferably $0.6<x<1$, and most preferably $x=0.8$.

The insertion layer AL1 is a film containing metal different from hafnium, and is a film containing aluminum (Al), and has a thickness of, for example, 1 nm to 4 nm. Specifically, the insertion layer AL1 is an aluminum (Al) film, an aluminum nitride (AlN) film, an aluminum carbide (AlC) film, an aluminum silicate (AlSiO) film, or an aluminum oxide film. In present embodiment, a metal oxide film containing aluminum (Al) and oxygen (O) is preferable as an insertion layer AL1, and an aluminum oxide film such as an $Al_2O_3$ film is most preferable.

The insulating film HSO2 is a film made of a material different from the material of the insertion layer AL1, and is a film containing hafnium (Hf), silicon (Si), and oxygen (O), and has a thickness of, for example, 5 nm to 9 nm. The insulating film HSO2 is preferably the same material as the insulating film HSO1.

As described above, in the present embodiment, one film containing aluminum (insertion layer AL1) is formed in the film containing hafnium, silicon, and oxygen (insulating film HSO1 and insulating film HSO2) in the charge storage layer CSL.

The insulating film (top insulating film) TP is a film having a dielectric constant greater than that of the silicon nitride film, and is a metal oxide film made of material different from the insulating film HSO1 and the insulating film HSO2, and has a thickness of, for example, 5 nm to 12 nm. Specifically, the insulating film TP is a film containing aluminum (Al) and oxygen (O), and is preferably an aluminum oxide film, an aluminum oxynitride film, or an aluminum silicate film. As the insulating film TP, other metal oxide film can be used, for example, a metal oxide film made of an oxide of any of titanium (Ti), zirconium (Zr), yttrium (Y), lanthanum (La), praseodymium (Pr), and lutetium (Lu) can be used as the insulating film TP1.

The insulating films TP mainly serve to prevent charges stored in the charge storage layer CSL from escaping to the memory gate electrode MG. For this reason, it is preferable that the insulating film TP has a thickness greater than that of the insertion layer AL1.

Incidentally, in a conventional nonvolatile memory cell, an Oxide Nitride Oxide (ONO) film in which a silicon oxide film, a silicon nitride film as a charge storage layer, and a silicon oxide film are stacked, is known as a gate dielectric film having trapping levels. When the ONO film is used, the dielectric constant is relatively low, and thus the Equivalent Oxide Thickness (EOT) of the gate dielectric film is increased. For this reason, there is a fear that the operating voltages may be increased by increasing the EOT of the gate dielectric film. In addition, if the physical film thickness is to be reduced in order to reduce the EOT of the gate dielectric film, there is a fear that the retention characteristics (charge retention characteristic) may be deteriorated due to leakage of charges stored in the charge storage layer. These degrade the reliability of the semiconductor device.

In present embodiment, the charge storage layer CSL is mainly formed of an insulating film HSO1 and an insulating film HSO2 which are high dielectric constant films. The insulating film TP is also a high dielectric constant film. With these films, the physical thickness of the gate dielectric film MZ can be increased while suppressing the EOT of the gate dielectric film MZ, so that degradation of retention characteristics due to leakage can be prevented and retention characteristics can be improved. In addition, since the EOT can be reduced while securing the physical thickness of the gate dielectric film MZ, the operating voltage and the operating speed of the memory cell MC1 can be reduced while preventing degradation of retention characteristics due to leakage.

Here, although there are many trapping levels of the charge storage layer CSL of the present embodiment exist in the insulating film HSO1 and the insulating film HSO2 which are the HfxSi1-xO2 (0<x<1) films, more trapping levels exist in the vicinity of the interface between the insulating film HSO1 and the insertion layer AL1 and in the vicinity of the interface between the insulating film HSO2 and the insertion layer AL1. Therefore, more trapping levels can be present at positions close to the center of the charge storage layer CSL. That is, a large number of deep trapping levels can be present in the charge storage layer CSL at a position away from the lower surface of the insulating film HSO1 and at a position away from the upper surface of the insulating film HSO2. As will be described later with reference to FIG. 7, many deep trapping levels exist at the interface between the hafnium silicate film and the aluminum oxide film. Since such an interface can be formed in present embodiment, many deep trapping levels can be formed. As a result, charges stored in the charge storage layer CSL are less likely to escape from the charge storage layer CSL, and the retention characteristics of the memory cell MC1 can be improved.

Further, the insertion layer AL1 is a film provided to increase the number of trapping levels in the charge storage layer CSL. For example, when the insertion layer AL1 is an aluminum oxide film and the insulating films HSO1 and HSO2 are hafnium silicate films, the dielectric constant of the aluminum oxide film is lower than that of the hafnium silicate film. For this reason, it is preferable that the thickness of the insertion layer AL1 is not greater than required, and it is preferable that the thickness of the insertion layer AL1 is smaller than the thickness of the insulating film HSO1 and the thickness of the insulating film HSO2.

Comparison of the Semiconductor Devices of First Compared Examples to Third Compared Example with the Semiconductor Device of the Present Embodiment The above-described improvement in retention characteristics will be described in detail below, using FIGS. 5 to 8 and FIGS. 27 to 29.

Figure 5:
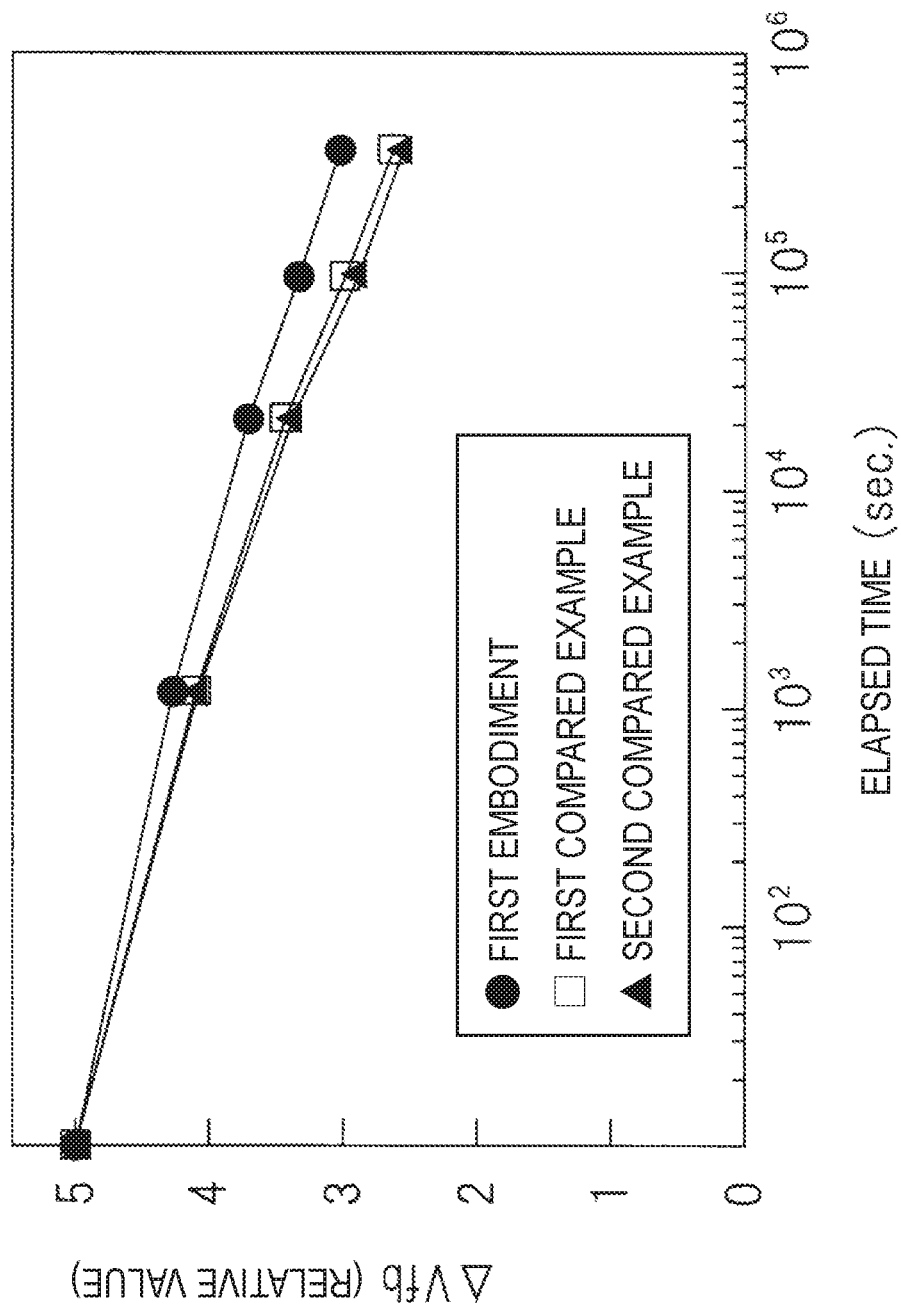
FIG. 5 is a graph showing the results of the experiments by the inventors of the present application.
Figure 27:
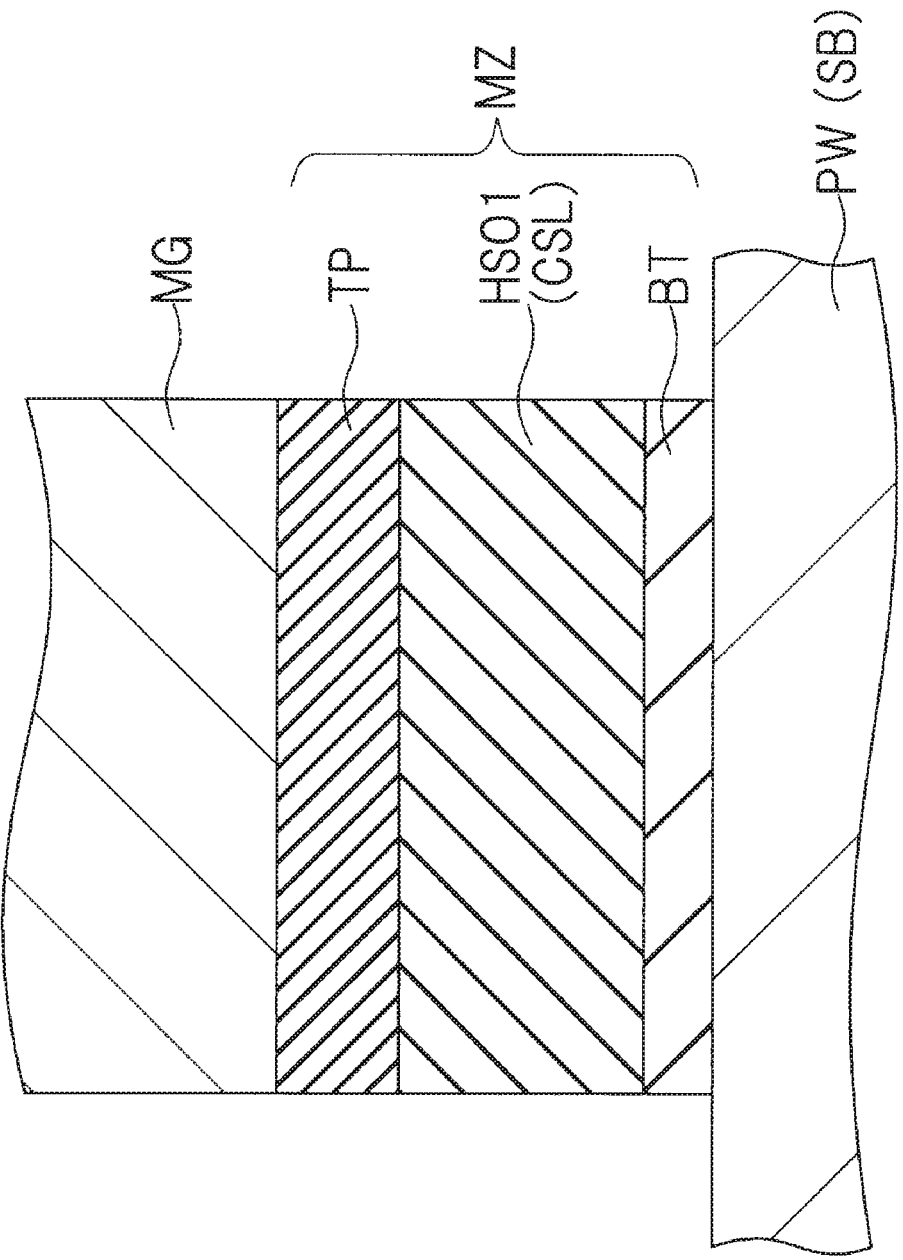
FIG. 27 is an enlarged cross sectional view of the main portion of a semiconductor device of first compared example.
Figure 28:
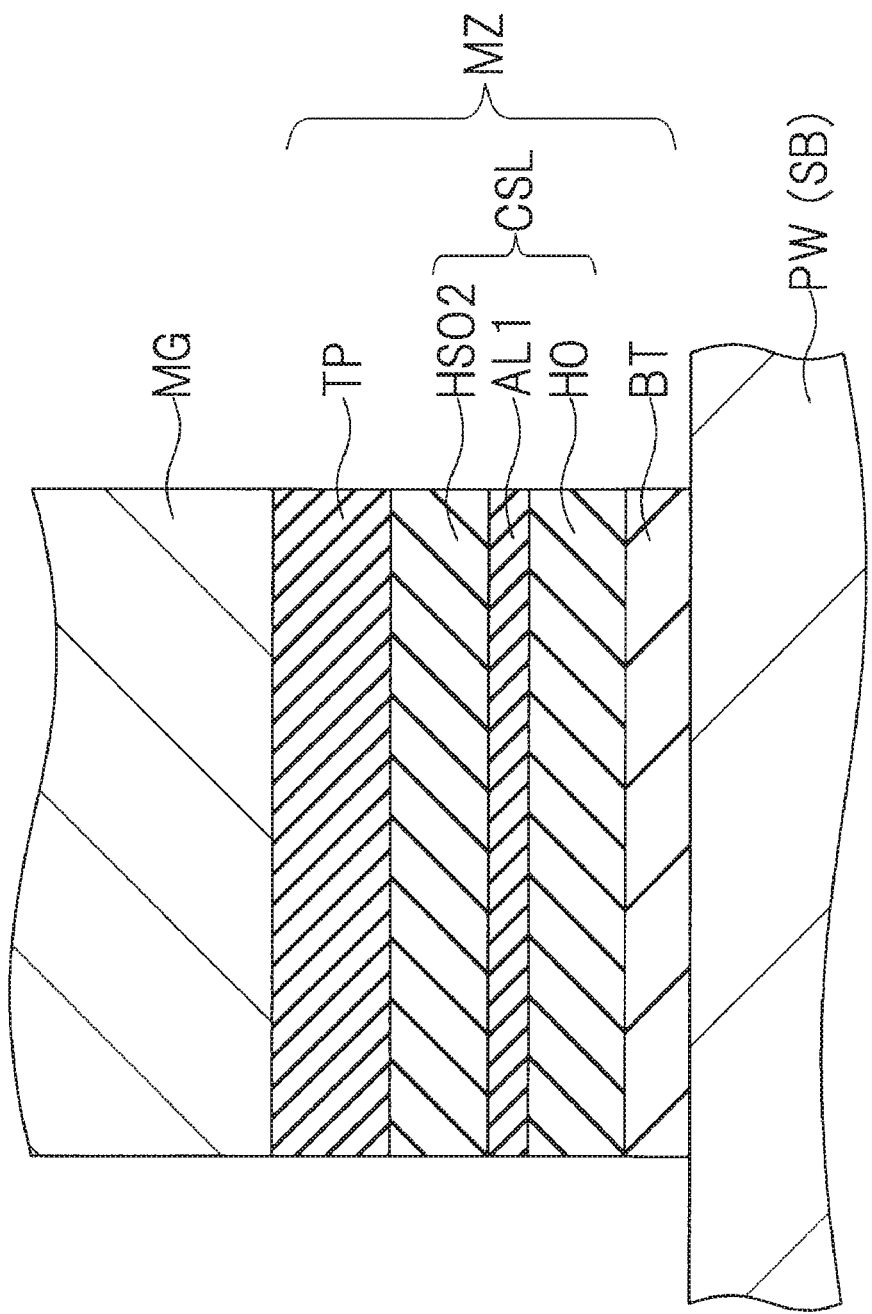
FIG. 28 is an enlarged cross sectional view of the main portion of a semiconductor device of second compared example.
Figure 29:
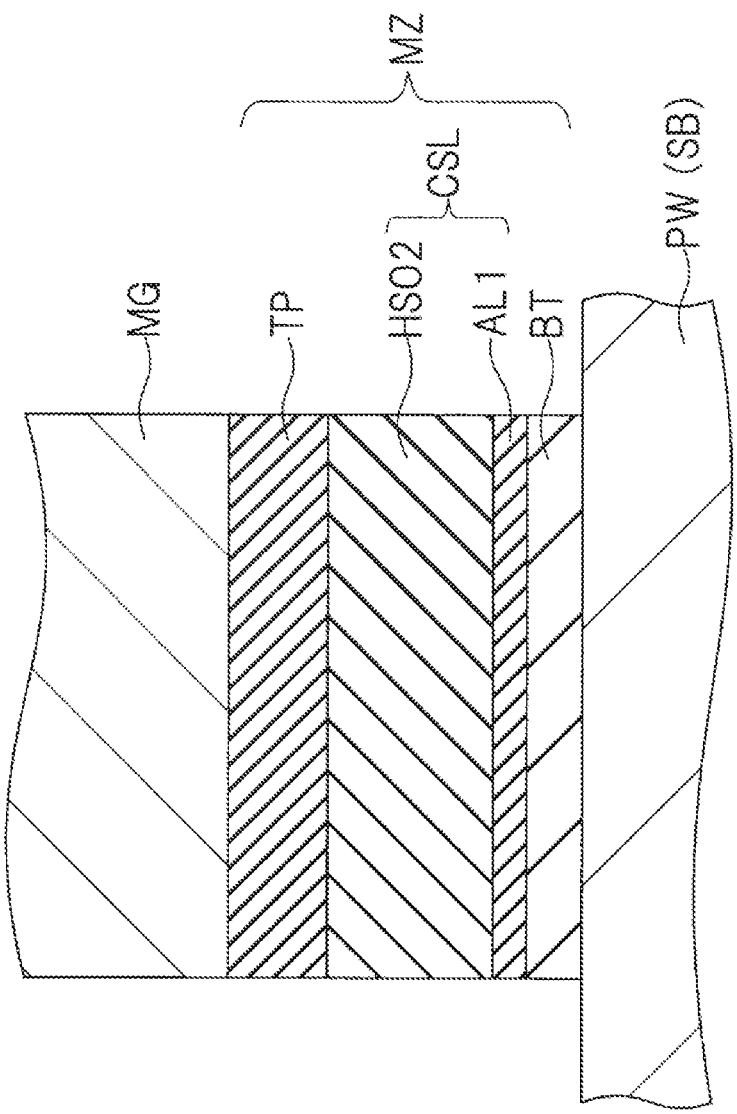
FIG. 29 is an enlarged cross sectional view of the main portion of a semiconductor device of third compared example.

FIGS. 27 to 29 are an enlarged cross sectional view of the main portion of the semiconductor device of first compared example to third compared example, respectively. FIG. 6 is a schematic diagram showing the trapping levels existing inside the charge storage layer CSL, and FIGS. 5, 7, and 8 are graphs showing experimental results by the inventors of the present application.

In the semiconductor device of the first compared example, as shown in FIG. 27, only the insulating film HSO1 is formed as the charge storage layer CSL, and the charge storage layer CSL does not include the insertion layer AL1 and the insulating film HSO2. The thickness of the insulating film HSO1 of the first compared example is about the sum of the thickness of the insulating film HSO1, the thickness of the insertion layer AL1, and the thickness of the insulating film HSO2 in the present embodiment.

In the semiconductor device of the second compared example, as shown in FIG. 28, an insulating film HO, an insertion layer AL1, and an insulating film HSO2 are formed as charge storage layer CSL. The insulating film HO is not an HfxSi1-xO2 (0<x<1) film like the insulating film HSO1 of present embodiment, but a hafnium oxide film (HfO film). The thickness of the insulating film HO of the second compared example is about the same as the thickness of the insulating film HSO1 of the present embodiment.

In the semiconductor device of the third compared example, as shown in FIG. 29, the insertion layer AL1 and the insulating film HSO2 are formed as the charge storage layer CSL, and the insulating film HSO1 is not formed. Therefore, the insertion layer AL1 of the third compared example is in direct contact with the insulating film BT. The thickness of the insulating film HSO2 of the third compared example is about the sum of the thickness of the insulating film HSO1 and the thickness of the insulating film HSO2 in the present embodiment.

The horizontal axis of FIG. 5 indicates a period in which the memory cell MC1 is left at a high temperature of 150° C. after the write operation is performed on the memory cell MC1. The vertical axis of FIG. 5 indicates the variation $\Delta Vfb$ of the flat band voltage, and specifically indicates the difference between the flat band voltage (Vfb) after a predetermined period of time has elapsed after the write operation and the flat band voltage (Vfbi) prior to the write operation. The value of $\Delta Vfb$ in FIG. 5 is a relative value of the amount of variation of the flat band voltage. Here, the measurement is performed when an HfxSi1-xO2 (x=0.8) film is applied to the insulating film HSO1 and a silicon oxynitride (SiON) film is applied to the insulating film BT. Although the top insulating film TP is a single layer film such as an aluminum oxide film, the ratio of the variation $\Delta Vfb$ of the flat band voltages is the same even if the top insulating film TP is a stacked layer film such as the insulating film TP1 to TP3 as in the third embodiment described later.

As can be seen from FIG. 5, the amount of variation $\Delta Vfb$ decreases with the passage of time in present embodiment (●), first compared example (□), and second compared example (▲) respectively, while the amount of variation $\Delta Vfb$ is suppressed more in present embodiment (●) than in first compared example (□) and second compared example (▲). In other words, it can be seen that the retention characteristics are improved in the case of present embodiment (●) as compared with the case of first compared example (□) and second compared example (▲).

In addition, since the insertion layer AL1 is formed between the insulating film HSO1 and the insulating film HSO2 in present embodiment (●) from the result of improving the retention characteristics, it can be inferred that the trapping levels inside the charge storage layer CSL of present embodiment (●) are increased more than that of first compared example (□).

In addition, it can be inferred that by applying the HfxSi1-xO2 film to the insulating film HSO1 as in the case of present embodiment (●), the trapping levels inside the charge storage layer CSL are increased more than by applying the HfO film to the insulating film HSO1 as in the case of second compared example (▲).

FIG. 6 is a schematic diagram showing trapping levels existing in the charge storage layer CSL based on the structure of the first compared example. The mark (●) indicates deep trap levels having energies of 1.3 eV to 2.1 eV, and the mark (□) indicates shallow trap levels having energies of 0.8 eV to 1.3 eV. The distance Xa indicates the distance from the memory gate electrode MG to the vicinity of the interface between the insulating film TP and the insulating film HSO1. The distance Xb indicates the distance from the memory gate electrode MG to the inside of the insulating film HSO1. The distance Xc indicates the distance from the memory gate electrode MG to the vicinity of the interface between the insulating film HSO1 and the insulating film BT.

Figure 7A:
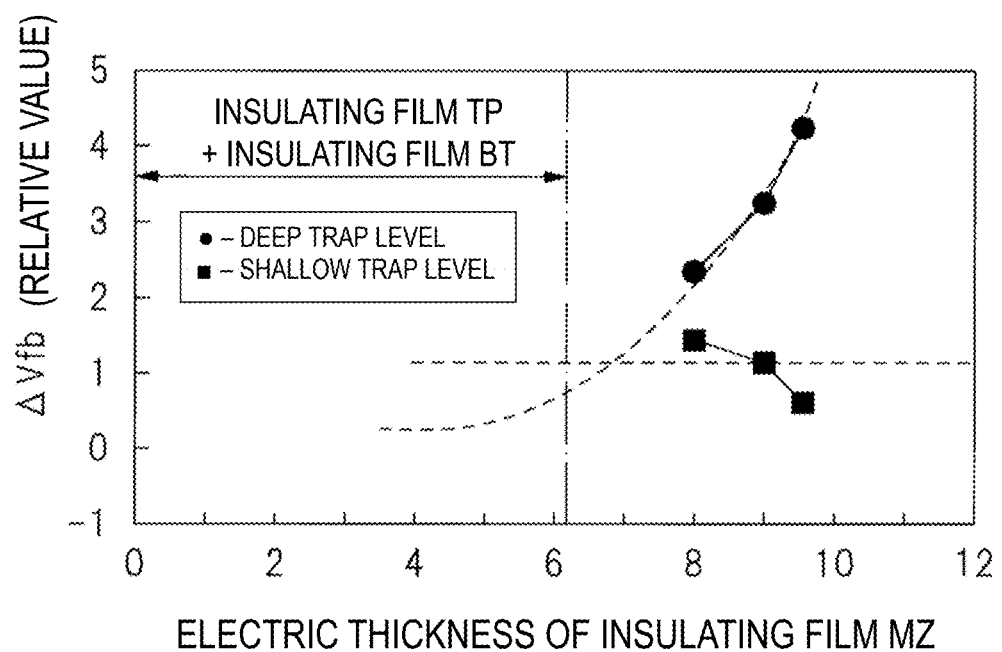
FIGS. 7A and 7B are graphs showing the results of the experiments by the inventors of the present application.
Figure 8:
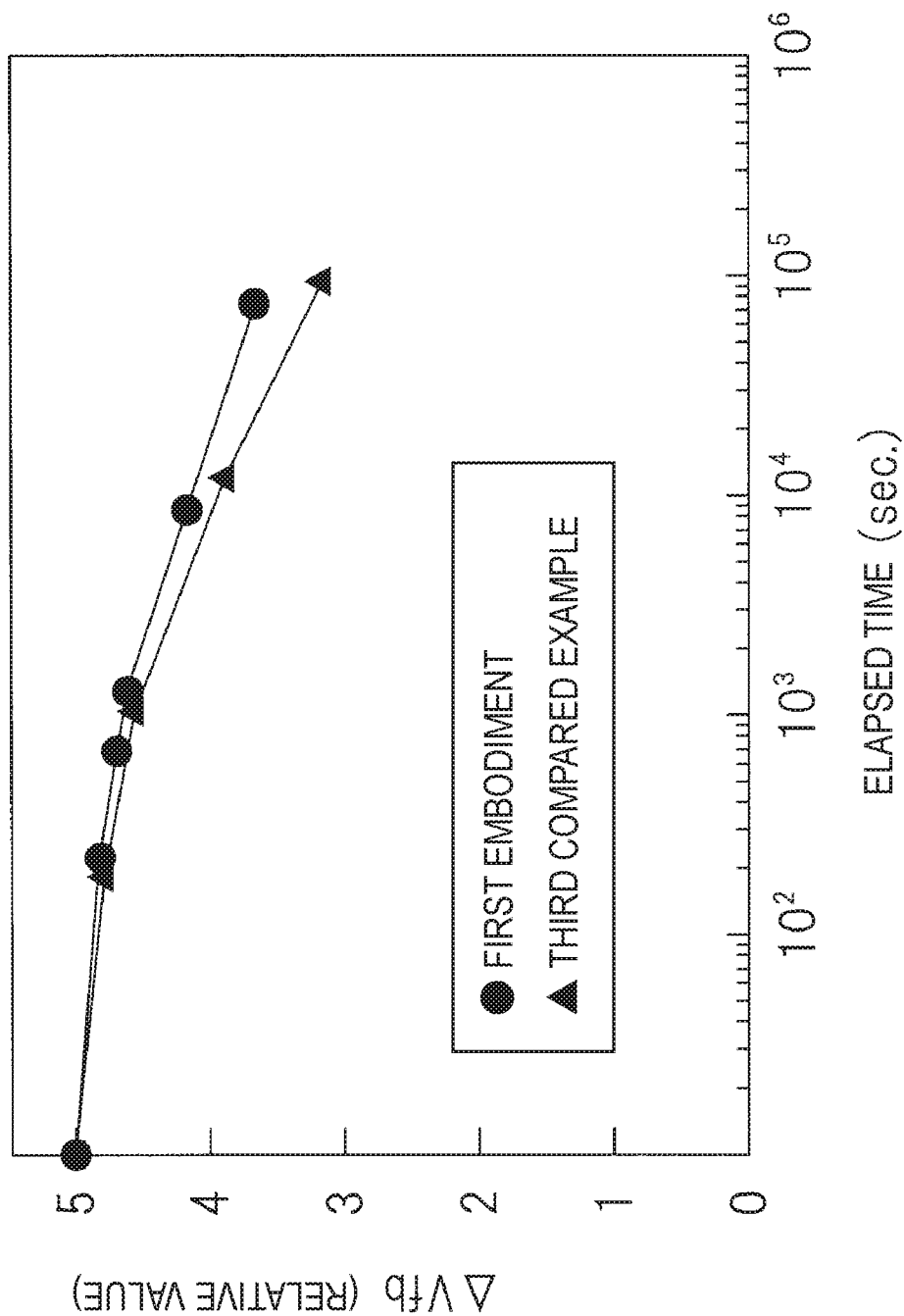
FIG. 8 is a graph showing the results of the experiments by the inventors of the present application.

FIG. 7A shows a graph obtained by decomposing the trapping levels existing inside the charge storage layer CSL for each energetic distribution depth by using the Thermally Stimulated Current-Capacitance Voltage (TSC-CV) method. The vertical axis of FIG. 7A shows an amount of variation $\Delta Vfb$ of the flat band voltage, and the horizontal axis of FIG. 7A shows an electric thickness of the gate dielectric film MZ. Here, the measurement result is shown assuming that the thickness of the insulating film BT and the thickness of the insulating film TP are constant.

Here, the amount of variation $\Delta Vfb$ of the flat band voltage due to the charges Q stored in the charge storage layer CSL is expressed by the following equation (1), which is proportional to the distance X from the memory gate electrode MG to the charges Q and inversely proportional to the dielectric constant k. The capacitance C is a capacitance between the charges Q and the memory gate electrode MG.

$$\Delta Vfb = Q/C = Q \times X/k \quad (1)$$

When the distance X is applied to the distances Xa-Xc in FIG. 6, the amount of variation $\Delta Vfb$ is almost constant when X=Xa. When X=Xb, since the distance Xb change inside the film of the charge storage layer CSL, the amount of variation $\Delta Vfb$ is proportional to the integral value ($\int Xb dx$) of Xb. That is, the amount of variation $\Delta Vfb$ is proportional to the square of Xb (Xb2). When X=Xc, the amount of variation $\Delta Vfb$ is proportional to Xc.

Therefore, as shown by the broken line in FIG. 7A, the amount of variation $\Delta Vfb$ is substantially constant in a thickness direction in the deep trap level (●) and the amount of variation $\Delta Vfb$ is substantially overlapped with the quadratic curve in the thickness direction in the shallow trap level (■).

Figure 7B:
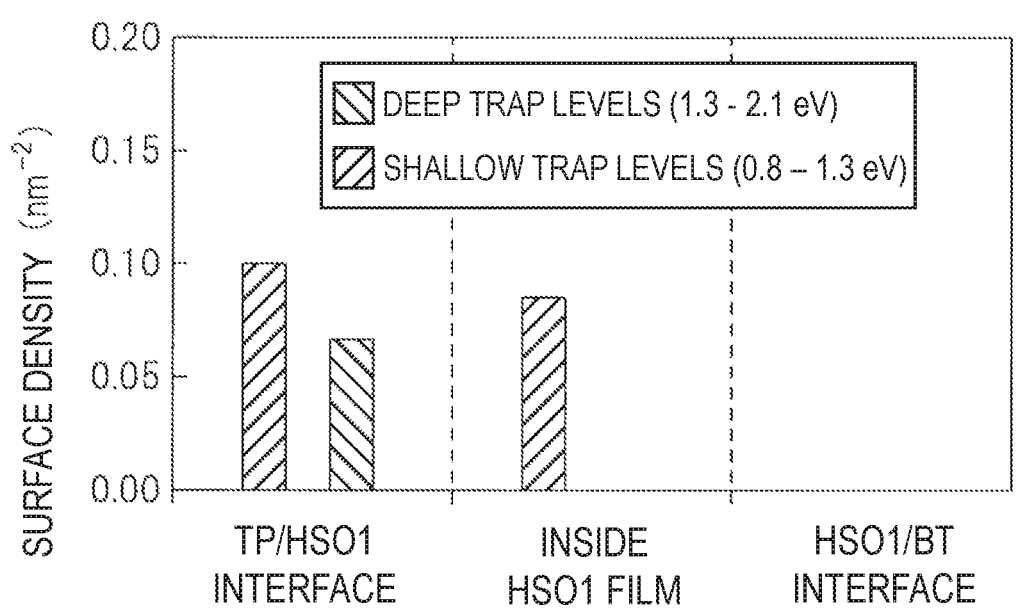

FIG. 7B is a graph showing surface density of trap levels existing in a gate dielectric film MZ obtained by the TSC-CV method. In FIG. 7, the horizontal axis represents regions in the vicinity of the interface between the insulating film TP and the insulating film HSO1, inside the film of the insulating film HSO1, and in the vicinity of the interface between the insulating film HSO1 and the insulating film BT. The vertical axis of FIG. 7 indicates the value of the surface density of the trap levels. Here, in the structure of first compared example, measurements are made when the insulating film BT is a silicon oxynitride film, the insulating film HSO1 is a hafnium silicate film, and the insulating film TP is an aluminum oxide film.

As shown in FIG. 7B, it can be seen that the deep trapping levels exist in a large amount at the interface between the insulating film TP which is an aluminum oxide film and the insulating film HSO1 which is a hafnium silicate film. That is, from the results of FIG. 7A and FIG. 7B, it can be seen that the trapping levels inside the gate dielectric film MZ are distributed as shown in FIG. 6.

Applying this result, the inventors of the present application have devised to form more interfaces between the hafnium silicate film and the aluminum oxide film by inserting the aluminum oxide film into the hafnium silicate film, thereby forming a large number of deep trapping levels. That is, in the present embodiment, since the insertion layer AL1 is formed between the insulating film HSO1 and the insulating film HSO2, many deep trapping levels can exist in the charge storage layer CSL.

As described above, when the results of FIGS. 6 and 7 are considered in combination with the result of FIG. 5, the retention characteristics of present embodiment are improved over the first compared example, although the thickness of the charge storage layer CSL of present embodiment is substantially the same as the thickness of the charge storage layer CSL of first compared example. This is because in the present embodiment, by forming the insertion layer AL1 between the insulating film HSO1 and the insulating film HSO2, a greater number of deep trapping levels can be caused to exist in the vicinity of the interface between the insulating film HSO1 and the insertion layer AL1 and in the vicinity of the interface between the insulating film HSO2 and the insertion layer AL1. In other words, the interface between the hafnium silicate film and the aluminum oxide film, that is, the interface at which deep trapping levels are easily formed, increases within the charge storage layer CSL. Therefore, a greater number of deep trapping levels can be present at a position close to the center of the charge storage layer CSL. As a result, the retention characteristics can be improved, so that the reliability of the semiconductor device can be improved.

Further, in the charge storage layer CSL of present embodiment, the insulating film HSO1 is a film containing hafnium (Hf), silicon (Si), and oxygen (O), and is preferably a hafnium silicate film such as an $HfxSi1-xO2$ ($0<x<1$) film. This makes it possible to increase the deep trapping levels inside the charge storage layer CSL and improve the retention characteristics than when the HfO film is applied to the insulating film HSO1 as in second compared example.

The horizontal axis of FIG. 8 shows how long the memory cell MC1 was left at room temperature (26° C.) after the write operation was performed on the memory cell MC1. Like the vertical axis of FIG. 5, the vertical axis of FIG. 8 indicates the amount of variation $\Delta Vfb$ of the flat band voltage.

As can be seen from FIG. 8, the amount of variation $\Delta Vfb$ decreases with the passage of time in present embodiment (●) and third compared example (▲) respectively, whereas the amount of variation $\Delta Vfb$ is suppressed more in present embodiment (●) than in third compared example (▲). In other words, it can be seen that the retention characteristics are improved in present embodiment (●) compared to third compared example (▲). In addition, although the graph of FIG. 8 is obtained by the memory cell MC1 left at room temperature, it is obvious that when the memory cell MC1 is left at a high temperature of 150° C. or more, for example, the difference between the amount of variation $\Delta Vfb$ of present embodiment (●) and the amount of variation $\Delta Vfb$ of third compared example (▲) becomes larger.

That is, as in third compared example, when the insulating film HSO1 is not formed and the insertion layer AL1 is formed so as to be in direct contact with the insulating film BT, retention characteristics deteriorated. Therefore, it is preferable that the insertion layer AL1 is formed between the insulating film HSO1 and the insulating film HSO2 and the insulating film HSO1 is in direct contact with the insulating film BT so that the insertion layer AL1 is not in direct contact with the insulating film BT as in present embodiment. As a result, retention characteristics can be improved.

Method of Manufacturing Memory Cell MC1

A method of manufacturing the semiconductor device of the present embodiment will be described below with reference to FIGS. 9 to 13.

Figure 9:
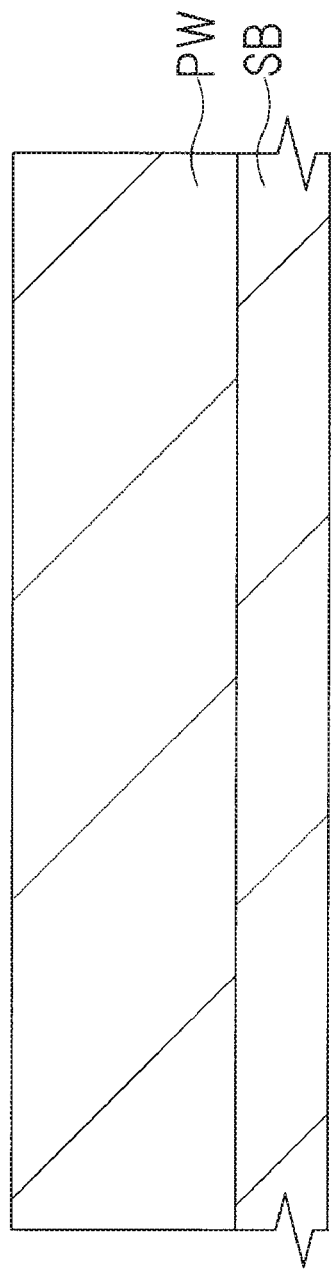
FIG. 9 is a cross sectional view describing the manufacturing process of a semiconductor device of first embodiment.

First, as shown in FIG. 9, boron (B) or boron difluoride (BF 2), for example, is introduced into the semiconductor substrate SB by photolithography and ion implantation to form p-type well region PW.

Figure 10:
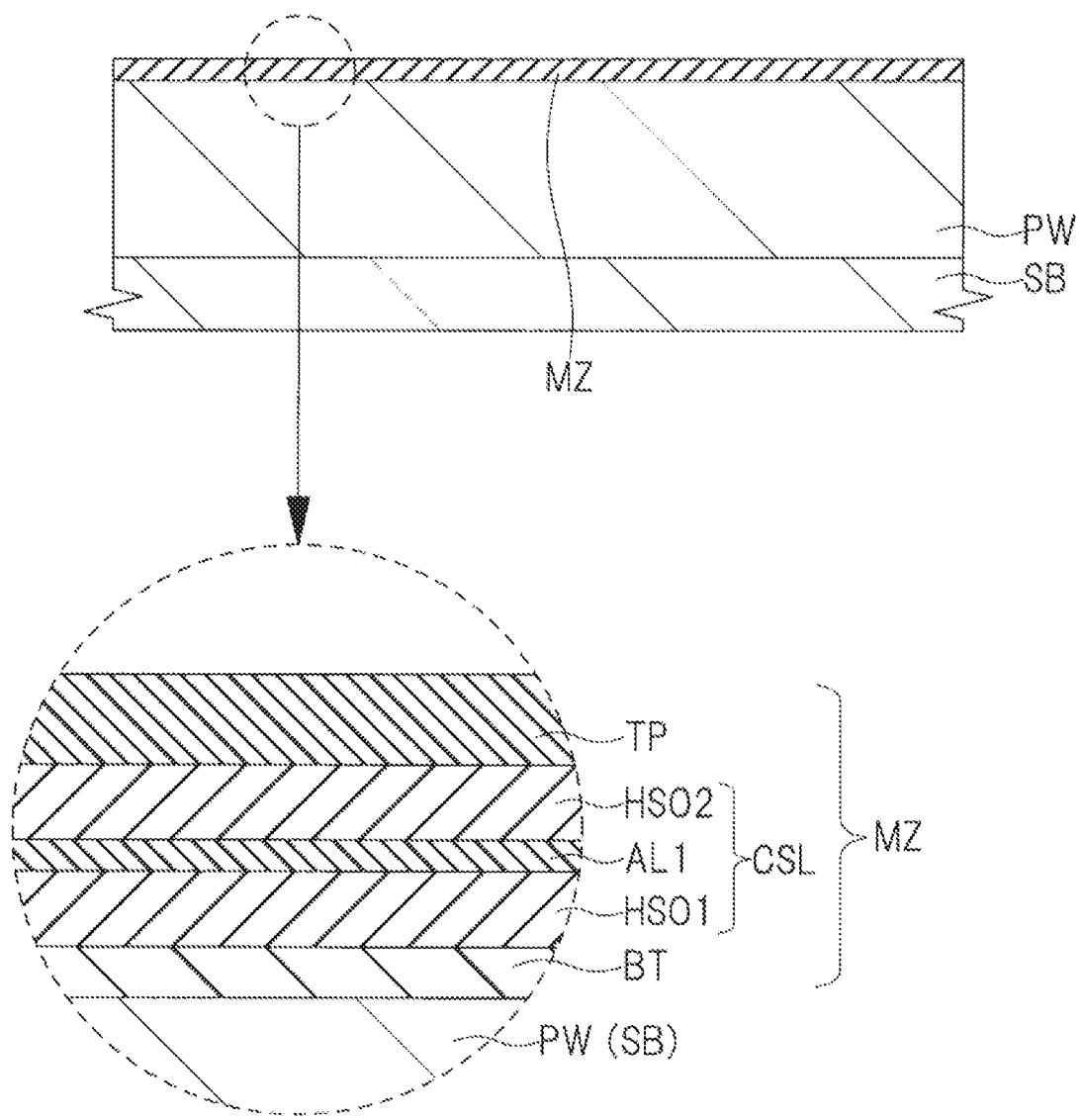
FIG. 10 is a cross sectional view showing a manufacturing process following FIG. 9.

FIG. 10 shows a step of forming gate dielectric film MZ. In FIG. 10 and subsequent figures, the gate dielectric film MZ is illustrated as a single layer film for the sake of clarity, but in reality, the gate dielectric film MZ is a multilayer film having an insulating film BT, an insulating film HSO1, an insertion layer AL1, an insulating film HSO2, and an insulating film TP, as shown in an enlarged view which is a region surrounded by a broken line in FIG. 10.

First, an insulating film BT, e.g., a silicon oxide film, is formed on the semiconductor substrate SB by, e.g., In Situ Steam Generation (ISSG) oxidation. The insulating film BT has a thickness of, for example, 2 nm to 5 nm. After that, NO treatment or plasma nitridation treatment may be performed to nitride the silicon oxide film to form a silicon oxynitride film.

Next, a charge storage layer CSL having an insulating film HSO1, an insertion layer AL1, and an insulating film HSO2 is formed on the semiconductor substrate SB via an insulating film BT.

For example, an insulating film HSO1 containing hafnium (Hf), silicon (Si), and oxygen (O) is formed on the insulating film BT by a Low Pressure Chemical Vapor Deposition (LPCVD) method or an Atomic Layer Deposition (ALD) method. The insulating film HSO1 has a thickness of, for example, 5 nm to 9 nm. The film formation temperature at the time of forming the insulating film HSO1 is, for example, 200° C. to 500° C.

Next, an insertion layer AL1 containing aluminum (Al) as a metal different from hafnium is formed on the insulating film HSO1 by an LPCVD method or an ALD method. The insertion layer AL1 has a thickness of, for example, 1 nm to 4 nm. The film formation temperature at the time of forming the insertion layer AL1 is, for example, 200° C. to 500° C.

Next, an insulating film HSO2 containing hafnium (Hf), silicon (Si), and oxygen (O) is formed on the insertion layer AL1 by an LPCVD method or an ALD method. The insulating film HSO2 is made of a material different from the insertion layer AL1 and is made of the same material as the insulating film HSO1 and has a thickness of, for example, 5 nm to 9 nm. The film formation temperature at the time of forming the insulating film HSO2 is, for example, 200° C. to 500° C.

Next, an insulating film TP containing aluminum (Al) and oxygen (O) is formed on the charge storage layer CSL by an LPCVD method or an ALD method. The insulating film TP is made of a material different from the material of the insulating film HSO2, and is preferably an aluminum oxide film, an aluminum oxynitride film, or an aluminum silicate film, and has a thickness of, for example, 5 nm to 10 nm. The film formation temperature at the time of forming the insulating film TP is, for example, 200° C. to 500° C.

Next, heat treatment is performed at, for example, 800° C. to 1050° C. for purpose mainly to crystallize the insulating film HSO1, the insertion layer AL1, the insulating film HSO2, and the insulating film TP. By this heat treatment, these insulating films are changed from an amorphous film to a polycrystalline film. Here, when the insulating film HSO1 and the insulating film HSO2 are $Hf_xSi_{1-x}O_2$ ($0.9 \leq x < 1$) films, the temperature of the heat treatment is 800° C. or more and less than 975° C., and when the insulating film HSO1 and the insulating film HSO2 are $Hf_xSi_{1-x}O_2$ ($0 < x < 0.9$) films, the temperature of the heat treatment is 975° C. or more and 1050° C. or less. By adjusting the temperature of the heat treatment in this manner, the insulating film HSO1 and the insulating film HSO2 can be appropriately crystallized.

Figure 11:
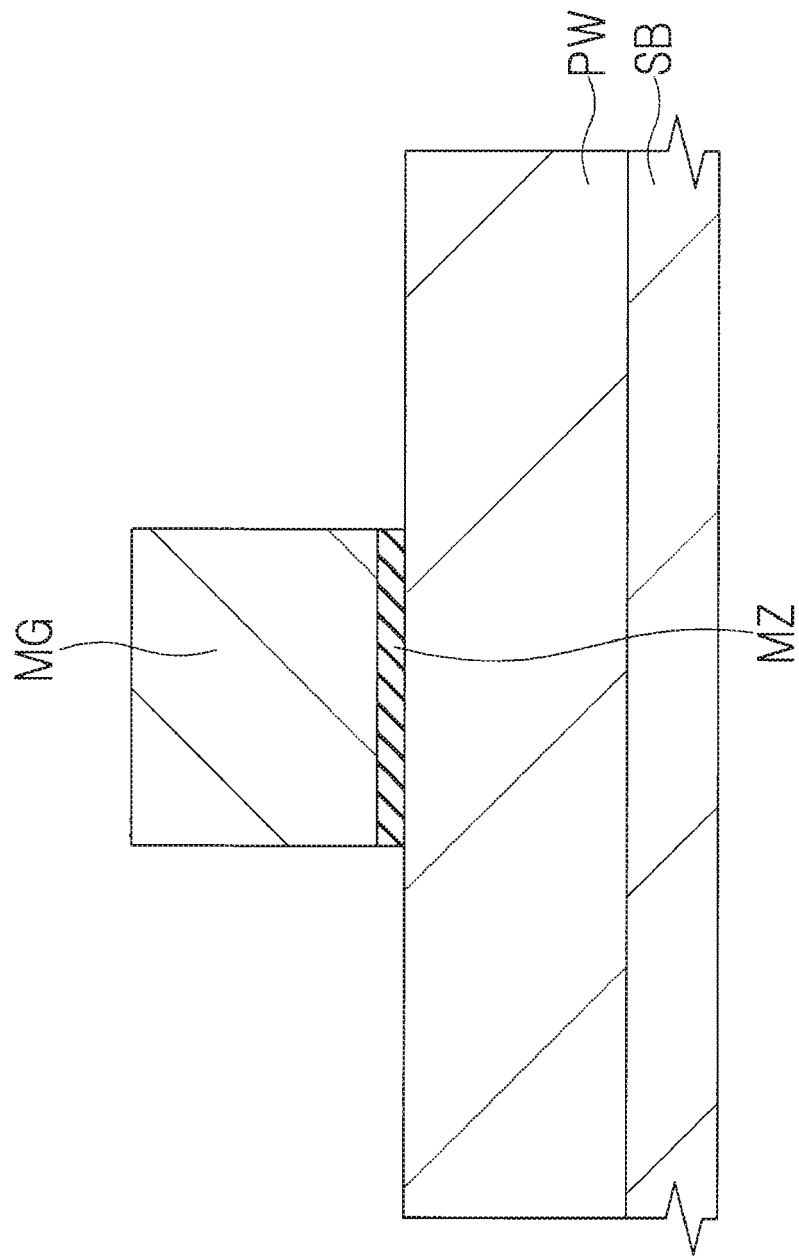
FIG. 11 is a cross sectional view showing a manufacturing process following FIG. 10.

FIG. 11 shows a step of forming a memory gate electrode MG.

First, a conductive film such as a polycrystalline silicon film is formed on the gate dielectric film MZ by, e.g., an LPCVD method. Next, an n-type impurity is introduced into the polycrystalline silicon film by a photolithography method and an ion implantation method. The conductive film may be a polycrystalline silicon film into which a p-type impurity is introduced or a polycrystalline silicon film into which an impurity is not introduced. The conductive film may be, for example, a metal film such as a titanium nitride film, an aluminum film, or a tungsten film, or a stacked film of these metal films.

Next, the conductive film is patterned by a photolithography method and an etching treatment to form a memory gate electrode MG. Thereafter, the gate dielectric film MZ exposed from the memory gate electrode MG is removed by dry etching treatment and wet etching treatment.

Figure 12:
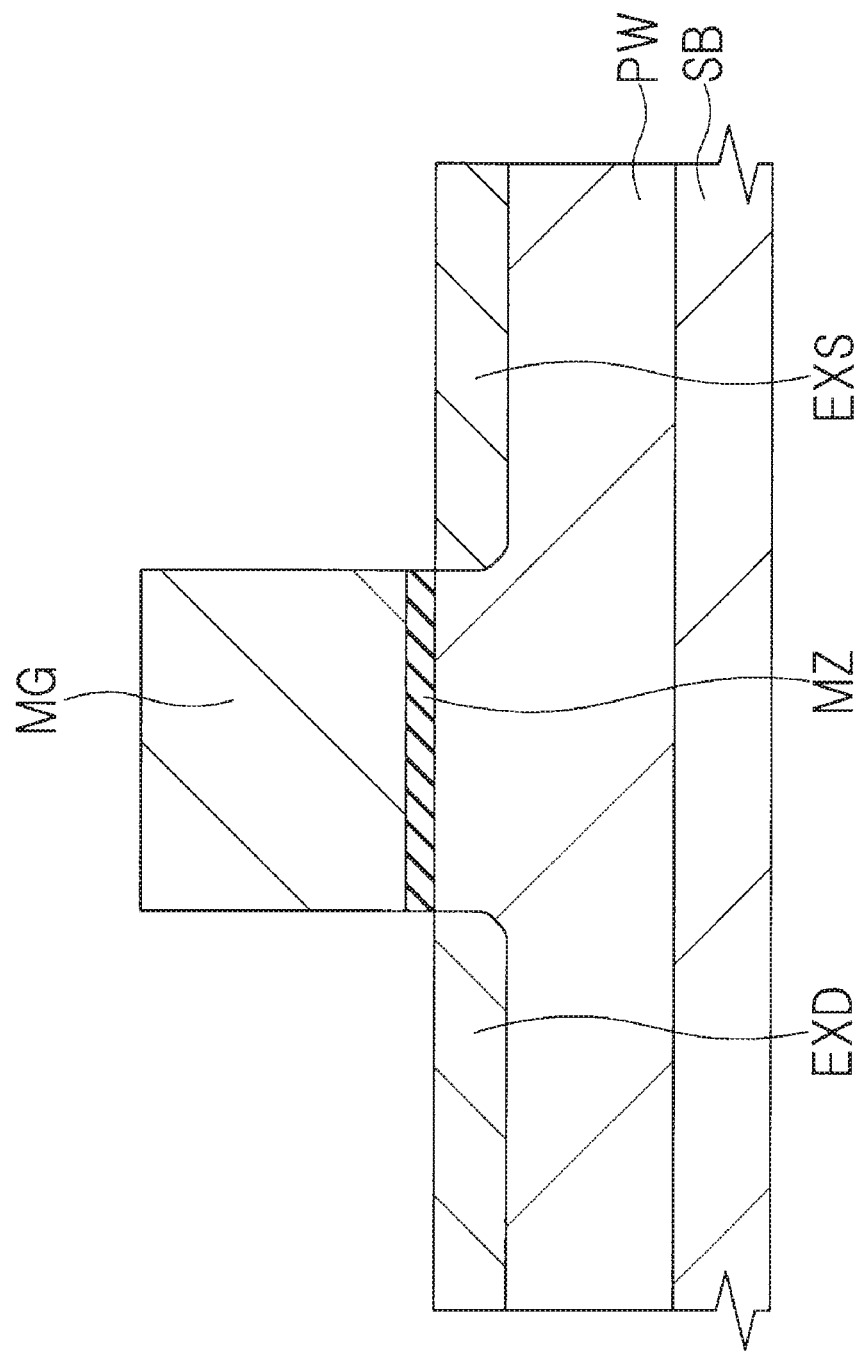
FIG. 12 is a cross sectional view showing a manufacturing process following FIG. 11.

FIG. 12 shows a step of forming the extension region EXS and the extension region EXD.

By introducing arsenic (As) or phosphorus (P), for example, into the well region PW next to the memory gate electrode MG by a photolithography method and an ion implantation method, the extension region EXS and the extension region EXD, which are n-type impurity regions, are formed. The extension region EXS forms a part of a source region of the memory cell MC1, and the extension region EXD forms a part of a drain region of the memory cell MC1.

Figure 13:
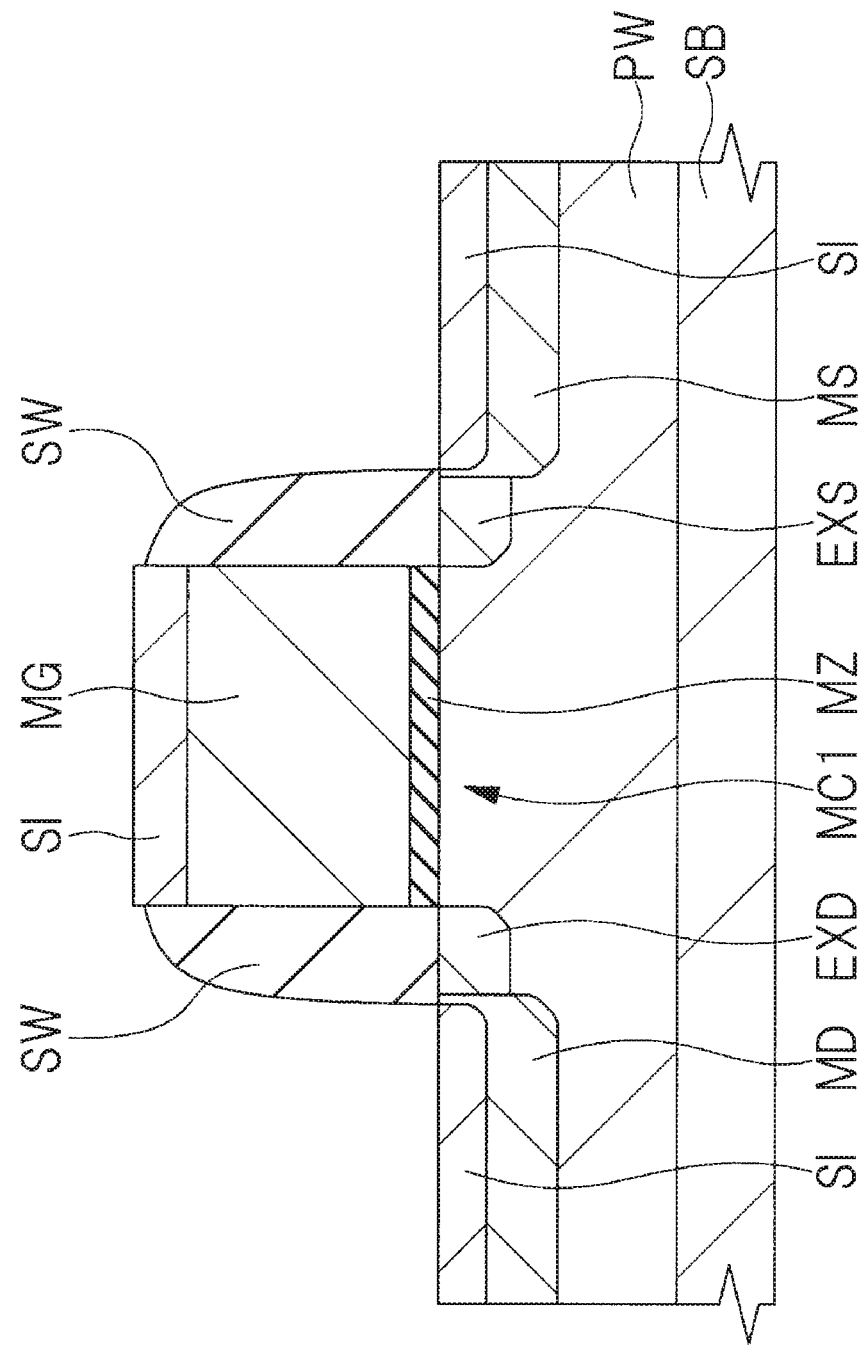
FIG. 13 is a cross sectional view showing a manufacturing process following FIG. 12.

FIG. 13 shows a step of forming the sidewall spacer SW, the diffusion region MS, the diffusion region MD, and the silicide layer SI.

First, an insulating film formed of, e.g., a silicon nitride film is formed by, e.g., an LPCVD method so as to cover the memory gate electrode MG. Next, anisotropic etching is performed on the insulating film to form sidewall spacers SW on the side surfaces of the memory gate electrode MG. Note that the insulating film forming the sidewall spacers SW may be a silicon oxide film and a silicon nitride film formed on the silicon oxide film.

Next, by a photolithography method and an ion implantation method, arsenic (As) or phosphorus (P), for example, is introduced into the well region PW using the sidewall spacers SW as a mask, thereby forming the diffusion region MS and the diffusion region MD which are n-type impurity regions. The diffusion region MS has an impurity concentration higher than that of the extension region EXS, is connected to the extension region EXS and forms a part of the source region of the memory cell MC1. The diffusion region MD has an impurity concentration higher than that of the extension region EXD, is connected to the extension region EXD, and forms a part of the drain region of the memory cell MC1.

Next, low resistance silicide layer SI is formed on the upper surface of each of the diffusion region MS, the diffusion region MS, and the memory gate electrode MG by a Self-Aligned Silicide (Salicide) technique.

Specifically, the silicide layer SI can be formed as follows. First, a metal film for forming the silicide layer SI is formed so as to cover the sidewall spacers SW, the diffusion region MS, the diffusion region MS, and the memory gate electrode MG. The metal film is made of, for example, cobalt, nickel, or nickel platinum alloy. Next, the semiconductor substrate SB is subjected to a first heat treatment at, e.g., 300° C. to 500° C. and a second heat treatment at, e.g., 600° C. to 700° C., so that the materials included in the diffusion region MS, the diffusion region MD, and the memory gate electrode MG react with the metal film. As a result, silicide layer SI is formed on the upper surface of each of the diffusion region MS, the diffusion region MS, and the memory gate electrode MG. Thereafter, an unreacted metal film is removed.

As described above, memory cell MC1 of the present embodiment is formed.

After the step of FIG. 13, the interlayer insulating film IL1, the plugs PG, the interlayer insulating film IL2, and the wirings M1 are formed, whereby the semiconductor device shown in FIG. 1 is manufactured.

First, the interlayer insulating film IL1 is formed so as to cover the memory cell MC1. As the interlayer insulating film IL1, a single film of a silicon oxide film, a stacked film of a silicon nitride film and a thick silicon oxide film formed thereon, or the like can be used. After the interlayer insulating film IL1 is formed, the upper surface of the interlayer insulating film IL1 may be polished by a Chemical Mechanical Polishing (CMP) method as required.

Next, contact holes are formed in the interlayer insulating film IL1 by a photolithography method, a dry etching method, or the like, and a conductive film mainly made of tungsten or the like is buried in the contact holes, thereby forming a plurality of plugs PG in the interlayer insulating film IL1. The plugs PG are connected to the diffusion region MS and MD via silicide layer SI, respectively. The memory gate electrode MG is also connected to the plug PG, but are not shown in the present embodiment.

Next, the interlayer insulating film IL2 is formed on the interlayer insulating film IL1 in which the plugs PG are buried. Thereafter, after trenches for wirings are formed in the interlayer insulating film IL2, a conductive film containing, for example, copper as a main component is buried in the trenches for wirings, thereby forming wirings M1 connected to the plugs PG in the interlayer insulating film IL2. The structure of the wirings M1 is called a Damascene wiring structure.

Thereafter, the second and subsequent layers of wirings are formed by a Dual Damascene method or the like, but their descriptions and illustrations are omitted here. The wiring layer above the wirings M1 and the wirings M1 is not limited to damascene wiring structures, and may be formed by patterning a tungsten film or an aluminum film, for example.

Second Embodiment

Figure 14:
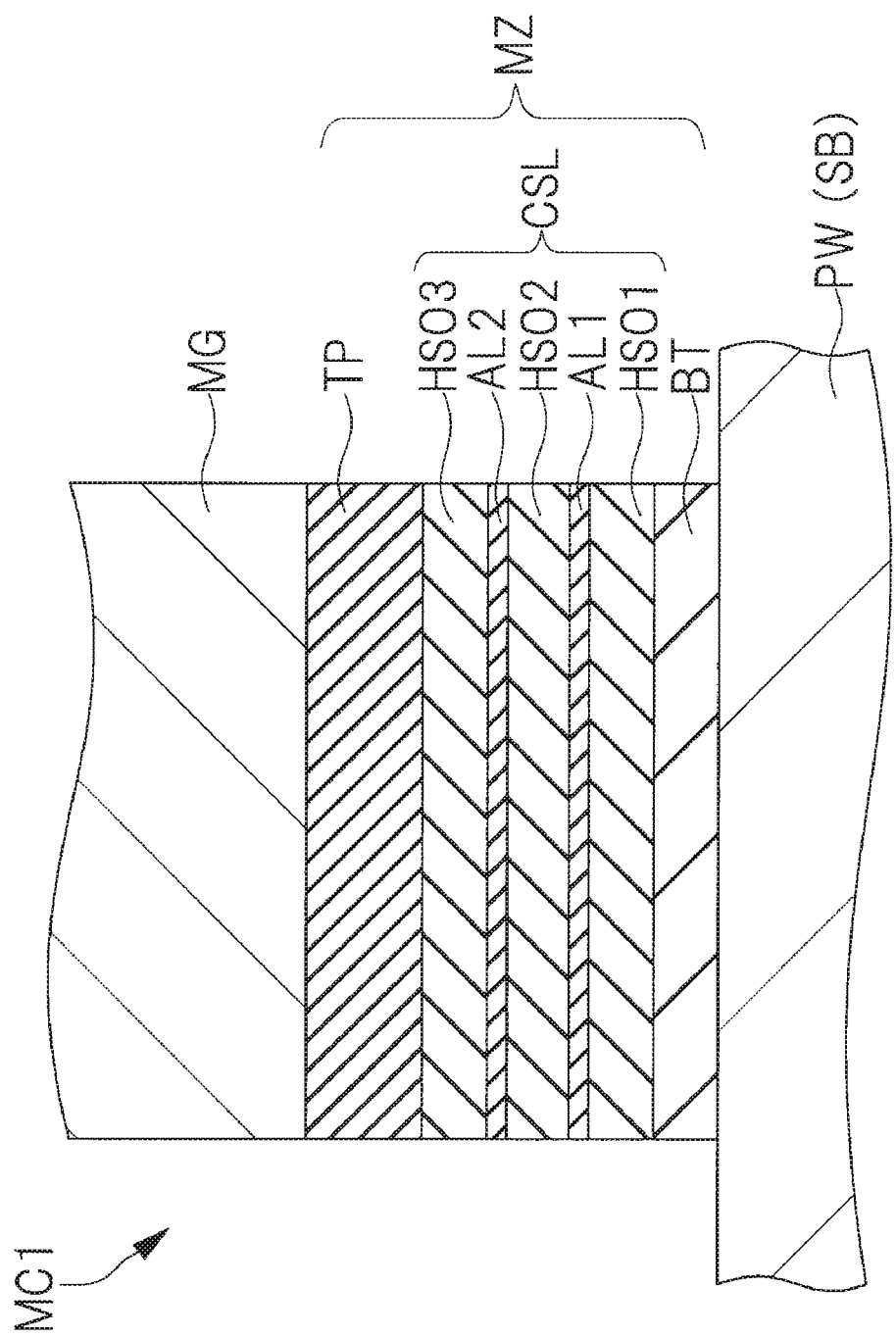
FIG. 14 is an enlarged cross sectional view of the main portion of a semiconductor device of second embodiment.

A semiconductor device of the second embodiment will be described below with reference to FIG. 14. In the following explanation, differences from the first embodiment will be mainly explained. FIG. 14 is an enlarged cross sectional view of a main portion of the semiconductor device of the second embodiment, and is a cross sectional view showing a detailed configuration of the gate dielectric film MZ.

In the first embodiment, a single aluminum oxide film (an insertion layer AL1) is formed in a hafnium silicate film (an insulating film HSO1 and an insulating film HSO2) inside the charge storage layer CSL. That is, the insertion layer AL1 is formed between the insulating film HSO1 and the insulating film HSO2.

As shown in FIG. 14, in the second embodiment, the charge storage layer CSL has an insulating films HSO1 to HSO3, an insertion layer AL1 between the insulating film HSO1 and the insulating film HSO2, and an insertion layer AL2 between the insulating film HSO2 and the insulating film HSO3.

The insulating film HSO3 is a film made of the same materials as the insulating film HOS1 or the insulating film HSO2, and is a hafnium silicate film or the like. The insertion layer AL2 is a film containing a metal other than hafnium, a film made of the same material as the material of the insertion layer AL1, an aluminum oxide film, or the like. The method of forming the insulating film HSO3 is the same as that of the insulating film HSO1, and the method of forming the insertion layer AL2 is the same as that of the insertion layer AL1.

As described above, in the second embodiment, a film containing two layers of aluminum (the insertion layer AL1 and the insertion layer AL2) is formed in the film containing hafnium, silicon and oxygen (the insulating films HSO1 to HSO3). Therefore, the interface between the hafnium silicate film and the aluminum oxide film is doubled as compared with the first embodiment. Therefore, more trapping levels can be present in the charge storage layer CSL. Therefore, the retention characteristics of the memory cell MC1 can be further improved.

In the second embodiment, a film containing two layers of aluminum (the insertion layer AL1 and the insertion layer AL2) is exemplified, however, a film containing three or more layers of aluminum may be formed.

For example, when the thickness of the insertion layer AL1 is set to 1 nm to 4 nm as in the second embodiment, the charge storage layer CSL has a maximum of four aluminum oxide films and a maximum of five hafnium silicate films. In this case, the number of interfaces between the hafnium silicate film and the aluminum oxide film in the charge storage layer CSL is eight.

Note that the charge storage layer CSL of the second embodiment has more films than the first embodiment, but if the total thickness of the charge storage layer CSL of the stacked film becomes too large, the EOT of the gate dielectric film MZ increases. Therefore, it is preferable to adjust the thickness of each of the insulating films HSO1 to HSO3, the insertion layer AL1, and the insertion layer AL2 so that the thickness of the charge storage layer CSL of the second embodiment is about the same as the thickness of the charge storage layer CSL of the first embodiment.

Third Embodiment

Figure 15:
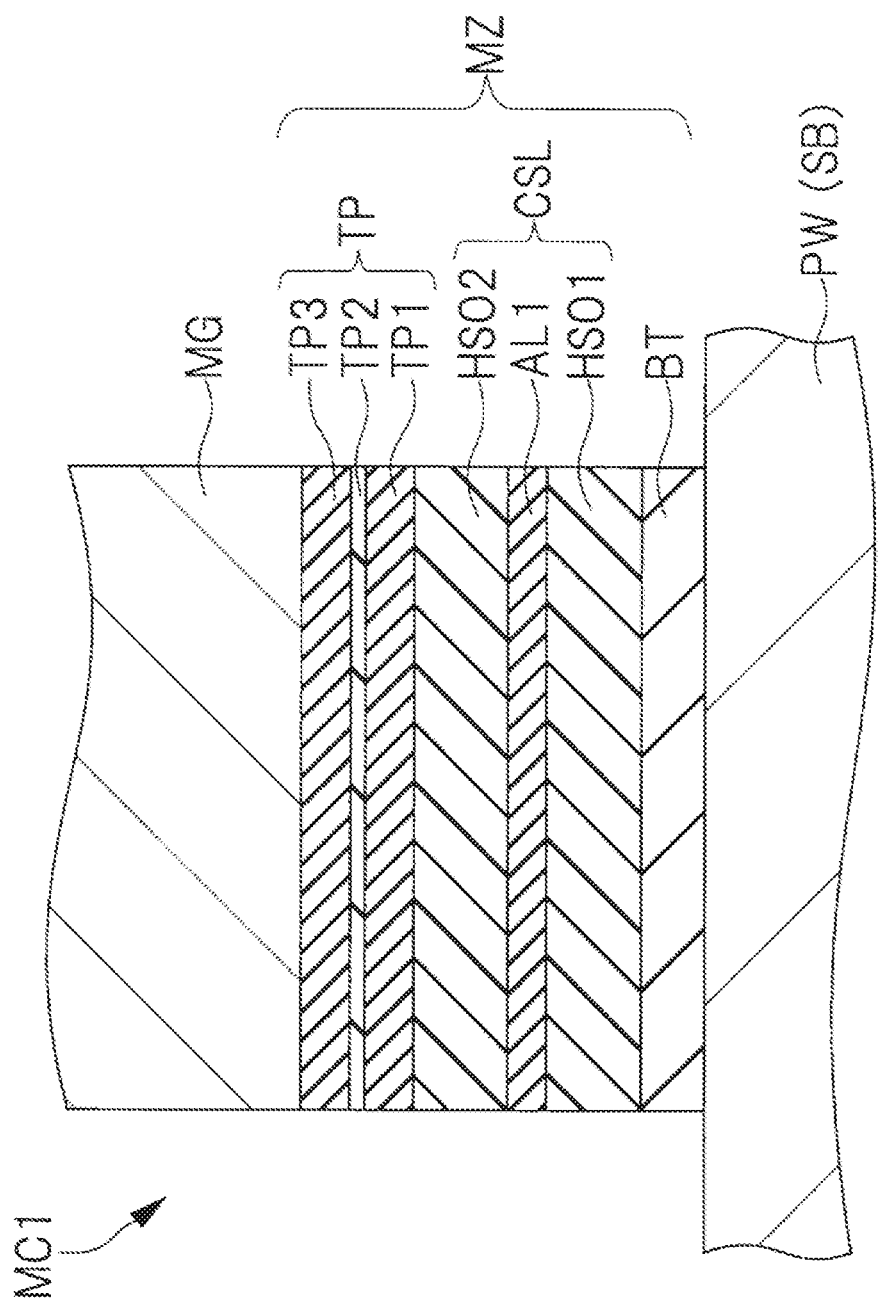
FIG. 15 is an enlarged cross sectional view of the main portion of a semiconductor device of third embodiment.
Figure 16:
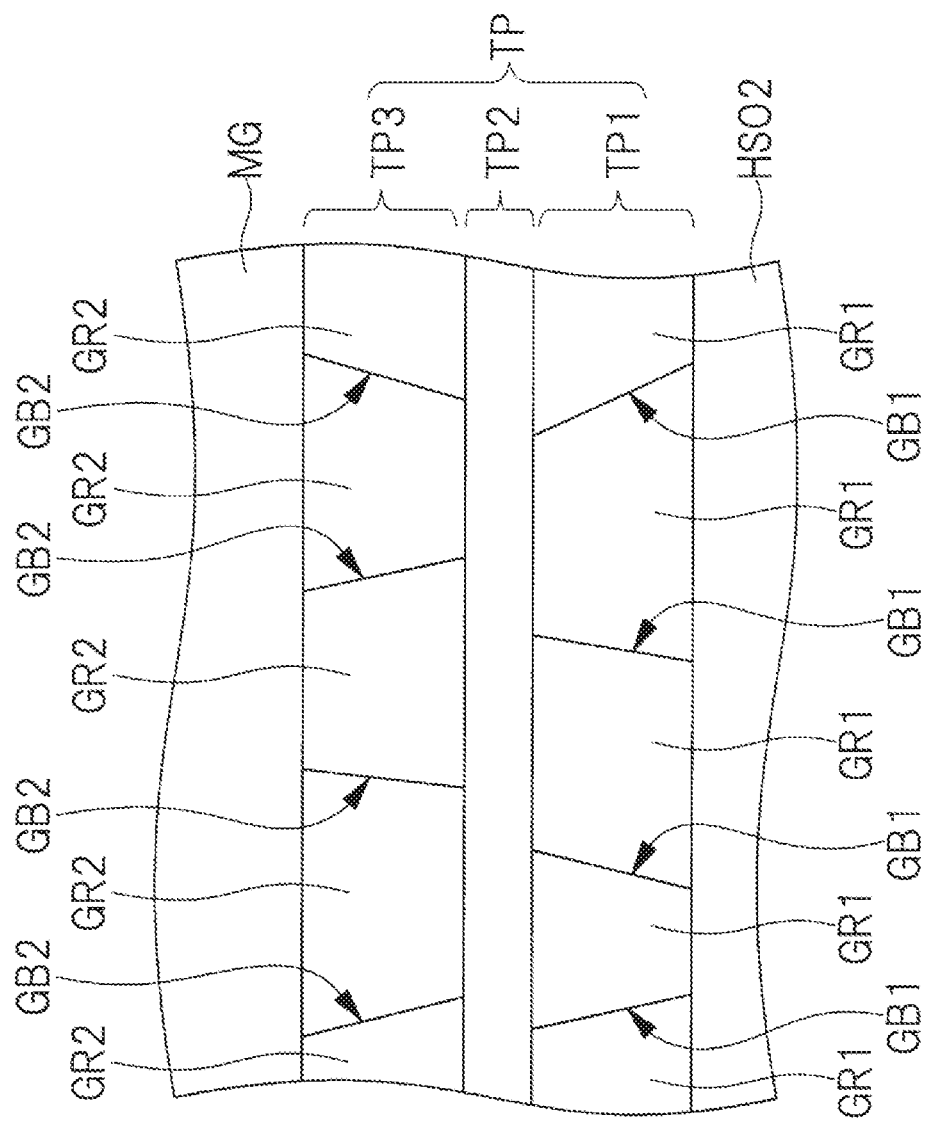
FIG. 16 is an enlarged cross sectional view of a portion of FIG. 15.

A semiconductor device of the third embodiment will be described below with reference to FIGS. 15 and 16. In the following explanation, differences from the first embodiment will be mainly explained. FIG. 15 is an enlarged cross sectional view of a main portion of the semiconductor device of the third embodiment, and is a cross sectional view showing a detailed configuration of the gate dielectric film MZ. FIG. 16 is a cross sectional view showing a detailed configuration of the insulating film TP by enlarging a part of the gate dielectric film MZ.

In the first embodiment, the top insulating film TP is a single layer film formed of an aluminum oxide film or the like.

As shown in FIG. 15, in the third embodiment, the top insulating film TP is a stacked film having an insulating film TP1 formed on the charge storage layer CSL, an insulating film TP2 formed on the insulating film TP1, and an insulating film TP3 formed on the insulating film TP2.

The insulating film TP1 is a film having a dielectric constant greater than that of the silicon nitride film, and is a metal oxide film made of a material different from the material of the insulating film HSO2, and has a thickness of, for example, 2 nm to 5 nm. Specifically, the insulating film TP1 is a film containing aluminum (Al) and oxygen (O), preferably an aluminum oxide film, an aluminum oxynitride film, or an aluminum silicate film, more preferably an $Al_2O_3$ film. As the insulating film TP1, another metal oxide film can be used, and for example, a metal oxide film made of an oxide of any of titanium (Ti), zirconium (Zr), yttrium (Y), lanthanum (La), praseodymium (Pr), and lutetium (Lu) can be used as the insulating film TP1.

The insulating film TP2 is a film made of a material different from the material of the insulating film TP1, and is a silicon oxide film, a silicon oxynitride film, or a silicon nitride film, and has a thickness of, for example, 1 nm to 2 nm. Such an insulating film TP2 can be formed by, for example, an LPCVD method or an ALD method.

The insulating film TP3 is a film made of the same materials as the insulating film TP1, and has a thickness of, for example, 2 nm to 5 nm. The insulating film TP1 and the insulating film TP3 can be formed in the same manner as the insulating film TP of the first embodiment.

The insulating films TP1 and the insulating film TP3 mainly serve to prevent charges stored in the charge storage layer CSL from escaping to the memory gate electrode MG. Therefore, the insulating film TP1 and the insulating film TP3 are preferably insulating films having band gaps larger than that of the insulating film constituting the insulating film HSO2, and preferably have a thickness greater than that of the insertion layer AL1.

In the third embodiment, the insulating film TP2 is formed between the insulating film TP1 and the insulating film TP3. Therefore, charges stored in the charge storage layer CSL can be prevented from easily escaping to the memory gate electrode MG via the insulating film TP, and the retention characteristics of the memory cell MC1 can be improved. This reason will be explained below.

In the first embodiment, a single layer film formed of an aluminum oxide film such as an insulating film TP is formed between the charge storage layer CSL and the memory gate electrode MG. At this time, if large crystal grains are formed inside the insulating film TP, the grain boundaries forming the outer periphery of the crystal grains connect the charge storage layer CSL and the memory gate electrode MG. For this reason, the grain boundaries become leakage paths, and charges stored in the charge storage layer CSL may leak to the memory gate electrode MG.

The insulating film TP2 is mainly provided to divide the leakage paths. That is, as shown in FIG. 16, the plurality of crystal grains GR1 constituting the insulating film TP1 and the plurality of crystal grains GR2 constituting the insulating film TP3 are separated by the insulating film TP2. Since the insulating film TP1 and the insulating film TP3 are formed separately from each other, the position of the grain boundaries GB1 of the insulating film TP1 and the position of the grain boundaries GB2 of the insulating film TP3 can be shifted, and the grain boundaries GB1 of the insulating film TP1 and the grain boundaries GB2 of the insulating film TP3 can be separated.

In addition, in the first embodiment, the insulating film TP is crystallized by performing heat treatment in the step of FIG. 10. The insulating film TP1 and the insulating film TP3 which are amorphous films are crystallized to form a polycrystalline film by performing the same heat treatment in the third embodiment, but the insulating film TP2 can be left as an amorphous film. Since the insulating film TP2 is an amorphous film, the possibility that the grain boundaries GB1 of the insulating film TP1 and the grain boundaries GB2 of the insulating film TP3 are connected to each other via the insulating film TP2 can be more reliably prevented.

As described above, in the third embodiment, it is possible to suppress leakage caused by grain boundaries of the insulating film TP between the charge storage layer CSL and the memory gate electrode MG. Therefore, the retention characteristics of the memory cell MC1 can be further improved, and the reliability of the semiconductor device can be further improved.

The techniques disclosed in the third embodiment can also be used in conjunction with the second embodiment.

Fourth Embodiment

A semiconductor device of the fourth embodiment will be described below with reference to FIGS. 17 to 19, and a method of manufacturing the semiconductor device of the fourth embodiment will be described with reference to FIGS. 20 to 25. In the following explanation, differences from the first embodiment will be mainly explained.

The memory cell MC1 of the first embodiment is a single gate memory cell having memory gate electrode MG.

The memory cell MC2 of the fourth embodiment is a split-gate type memory cell having not only a memory gate electrode MG but also a control gate electrode CG at a position adjoining the memory gate electrode MG. Hereinafter, a semiconductor device including a memory cell MC2 which is a nonvolatile memory cell in the fourth embodiment will be described. FIG. 17 shows a cross sectional view of the memory cell MC2.

Structure of Memory Cell MC2

Figure 17:
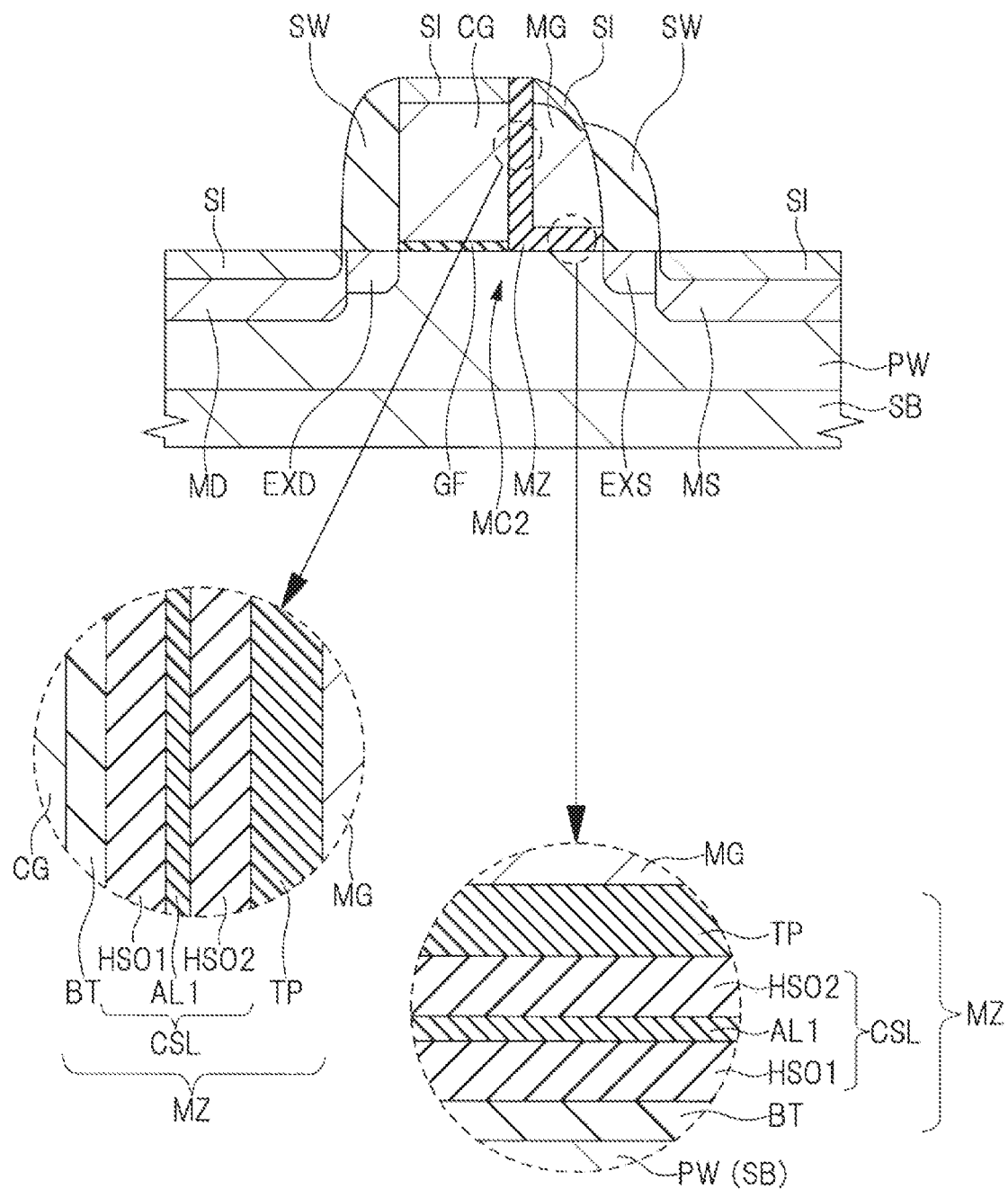
FIG. 17 is a cross sectional view showing a semiconductor device of fourth embodiment.

As shown in FIG. 17, a p-type well region PW is formed in a semiconductor substrate SB. A gate dielectric film GF is formed on the well region PW, and control gate electrode CG is formed on the gate dielectric film GF. The gate dielectric film GF is, for example, a silicon oxide film, and has a thickness of, for example, 2 nm to 5 nm. Instead of the silicon oxide film, the gate dielectric film GF may be a high dielectric constant film such as a metal oxide film such as a hafnium oxide film. The control gate electrode CG is, for example, a polycrystalline silicon film into which an n-type impurity is introduced. The control gate electrode CG may be, for example, a metal film such as a titanium nitride film, an aluminum film, or a tungsten film, or a stacked film of these metal films.

A gate dielectric film MZ is formed on the well region PW and on one side surface of the control gate electrode CG. The gate dielectric film MZ of the fourth embodiment is the same as the gate dielectric film MZ of the first embodiment. Note that in FIG. 17, the gate dielectric film MZ is illustrated as a single layer film for the sake of clarity of the drawing, but in reality, the gate dielectric film MZ is a multilayer film having the insulating film BT, the insulating film HSO1, the insertion layer AL1, the insulating film HSO2, and the insulating film TP, as shown in an enlarged view which is an area surrounded by a broken line in FIG. 17.

A memory gate electrode MG is formed on one side surface of the control gate electrode CG via the gate dielectric film MZ. That is, an insulating film such as gate dielectric film MZ is formed between the control gate electrode CG and the memory gate electrode MG, and the control gate electrode CG is insulated and separated from the memory gate electrode MG. Sidewall spacers SW are formed on the side surface of the memory gate electrode MG opposite to the control gate electrode CG, of the two side surfaces of the memory gate electrode MG, and on the other side surface of the control gate electrode CG.

An extension region EXS, which is an n-type impurity region, is formed in the well region PW under the sidewall spacer SW on the memory gate electrode MG side, and an extension region EXD, which is an n-type impurity region, is formed in the well region PW under the sidewall spacer SW on the control gate electrode CG side. The extension region EXS constitutes a part of the source region of the memory cell MC2, and the extension region EXD constitutes a part of the drain region of the memory cell MC2.

A diffusion region MS, which is an n-type impurity region, is formed in the well region PW at a position aligned the sidewall spacer SW on the memory gate electrode MG side, and a diffusion region MD, which is an n-type impurity region, is formed in the well region PW at a position aligned the sidewall spacer SW on the control gate electrode CG side. The diffusion region MS has an impurity concentration higher than that of the extension region EXS, is connected to the extension region EXS and forms a part of the source region of the memory cell MC2. The diffusion region MD has an impurity concentration higher than that of the extension region EXD, is connected to the extension region EXD, and forms a part of the drain region of the memory cell MC2.

Silicide layers SI are formed on the memory gate electrode MG, the control gate electrode CG, the diffusion region MS, and the diffusion region MD.

Although an interlayer insulating film IL1, plugs PG, an interlayer insulating film IL2, wirings M1, and the like are formed above the memory cell MC2 as in the first embodiment, the illustration thereof is omitted here.

Operation of Memory Cell MC2

Next, an exemplary operation of the memory cell MC2 which is a nonvolatile memory cell will be described referring to FIGS. 18 and 19. The memory cell MC2 described here is a selected memory cell among a plurality of memory cells MC2 existing in the semiconductor device.

Figure 18:
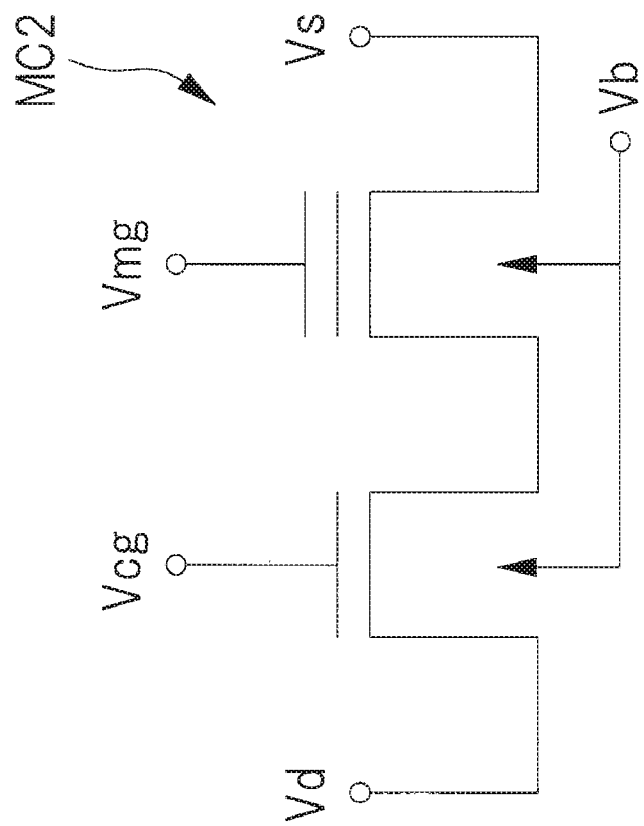
FIG. 18 is an equivalent circuit diagram of a memory cell of fourth embodiment.

FIG. 18 is an equivalent circuit diagram of the memory cell MC2 of the nonvolatile memory. FIG. 19 is a table showing examples of conditions for applying voltages to the respective portions of the memory cell MC2 at the time of "write", "erase" and "read". In the table of FIG. 19, the voltage Vd applied to the diffusion region MD which is the drain region, the voltage Vcg applied to the control gate electrode CG, the voltage Vmg applied to the memory gate electrode MG, the voltage Vs applied to the diffusion region MS which is the source region, and the voltage Vb applied to the well region PW are described in the "write", "erase", and "read" states, respectively.

Note that what is shown in the table of FIG. 19 is a suitable example of the voltage application condition, and is not limited to this, and various changes can be made as necessary. In the fourth embodiment, the injection of electrons into the charge storage layer CSL is defined as "write", and the injection of holes into the charge storage layer CSL is defined as "erase".

The write operation is performed by a write method using hot electron injection by source side injection, which is referred to as a Source Side Injection (SSI) method. For example, voltages as shown in the "write" column of FIG. 19 are applied to the respective portions of the memory cell MC2 to be written, and electrons are injected into the charge storage layer CSL to perform writing.

At this time, hot electrons are generated in a channel region covered with the memory gate electrode MG and the control gate electrode CG, and hot electrons are injected into the charge storage layer CSL under the memory gate electrode MG. The injected hot electrons are captured by the trapping levels in the charge storage layer CSL, and as a result, the threshold voltage of the memory transistor having the memory gate electrode MG rise. That is, the memory transistor is in the write state.

The erase operation is performed by an erasing method using hot hole injections by BTBT, which is called a Band-To-Band Tunneling (BTBT) method. That is, holes generated by the BTBT are injected into the charge storage layer CSL to perform erasing. For example, voltages as shown in the column "erase" in FIG. 19 are applied to the respective portions of the memory cell MC2 to be erased, holes are generated by BTBT phenomena, and holes are injected into the charge storage layer CSL by electric field acceleration. As a result, the threshold voltage of the memory transistor is lowered. That is, the memory transistor is in the erase state.

In the read operation, for example, voltages as shown in the column of "read" in FIG. 19 are applied to the respective portions of the memory cell MC2 to be read. By setting the voltage Vmg applied to the memory gate electrode MG at the time of reading to a value between the threshold voltage of the memory transistor in the write state and the threshold voltage of the memory transistor in the erase state, the write state or the erase state can be discriminated.

In the memory cell MC2 of the fourth embodiment, the gate dielectric film MZ is a multilayer film having an insulating film BT, an insulating film HSO1, an insertion layer AL1, an insulating film HSO2, and an insulating film TP, as in the memory cell MC1 of the first embodiment. Therefore, even in the fourth embodiment, the retention characteristics of the memory cell MC2 can be improved, and the reliability of the semiconductor device can be improved.

Method of Manufacturing Memory Cell MC2

The method of manufacturing the semiconductor device of the fourth embodiment will be described below with reference to the FIGS. 20 to 25.

Figure 20:
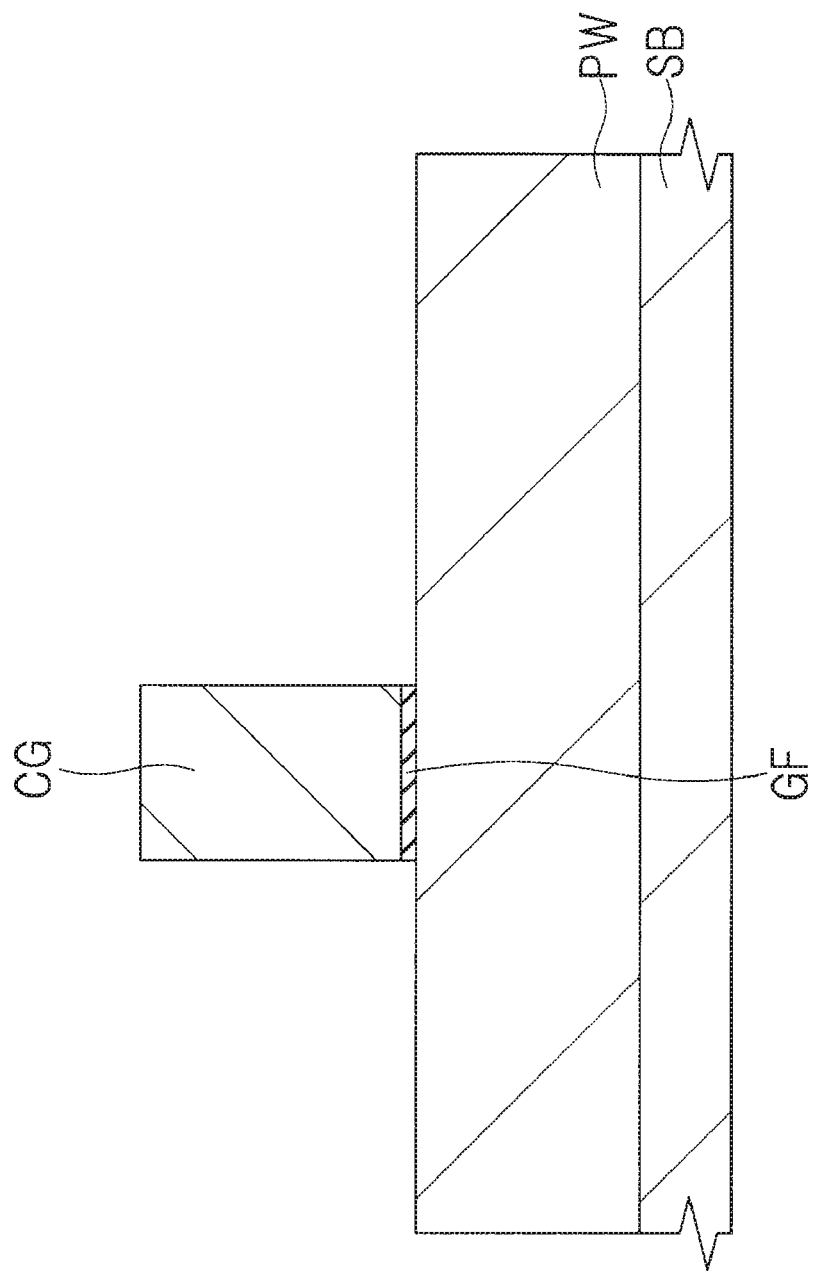
FIG. 20 is a cross sectional view showing the manufacturing process of a semiconductor device of fourth embodiment.

First, as shown in FIG. 20, p-type well region PW is formed in a semiconductor substrate SB by a photolithography method and an ion implantation method.

Next, a gate dielectric film GF made of, e.g., silicon oxide is formed by, e.g., a thermal oxidation method or an ISSG oxidation method. After that, NO treatment or plasma nitridation treatment may be performed to nitride the silicon oxide film to form a silicon oxynitride film. As the gate dielectric film GF, a metal oxide film such as a hafnium oxide film may be formed by, for example, an ALD method.

Next, a conductive film made of, e.g., a polycrystalline silicon film is deposited on the gate dielectric film GF by, e.g., a CVD method. The conductive film may be, for example, a metal film such as a titanium nitride film, an aluminum film, or a tungsten film, or a stacked film of these metal films. Next, the conductive film is patterned by a photolithography method and a dry etching method. Thus, the conductive film is processed to form the control gate electrode CG. Next, by removing the gate dielectric film GF exposed from the control gate electrode CG, the gate dielectric film GF is left below the control gate electrode CG.

Figure 21:
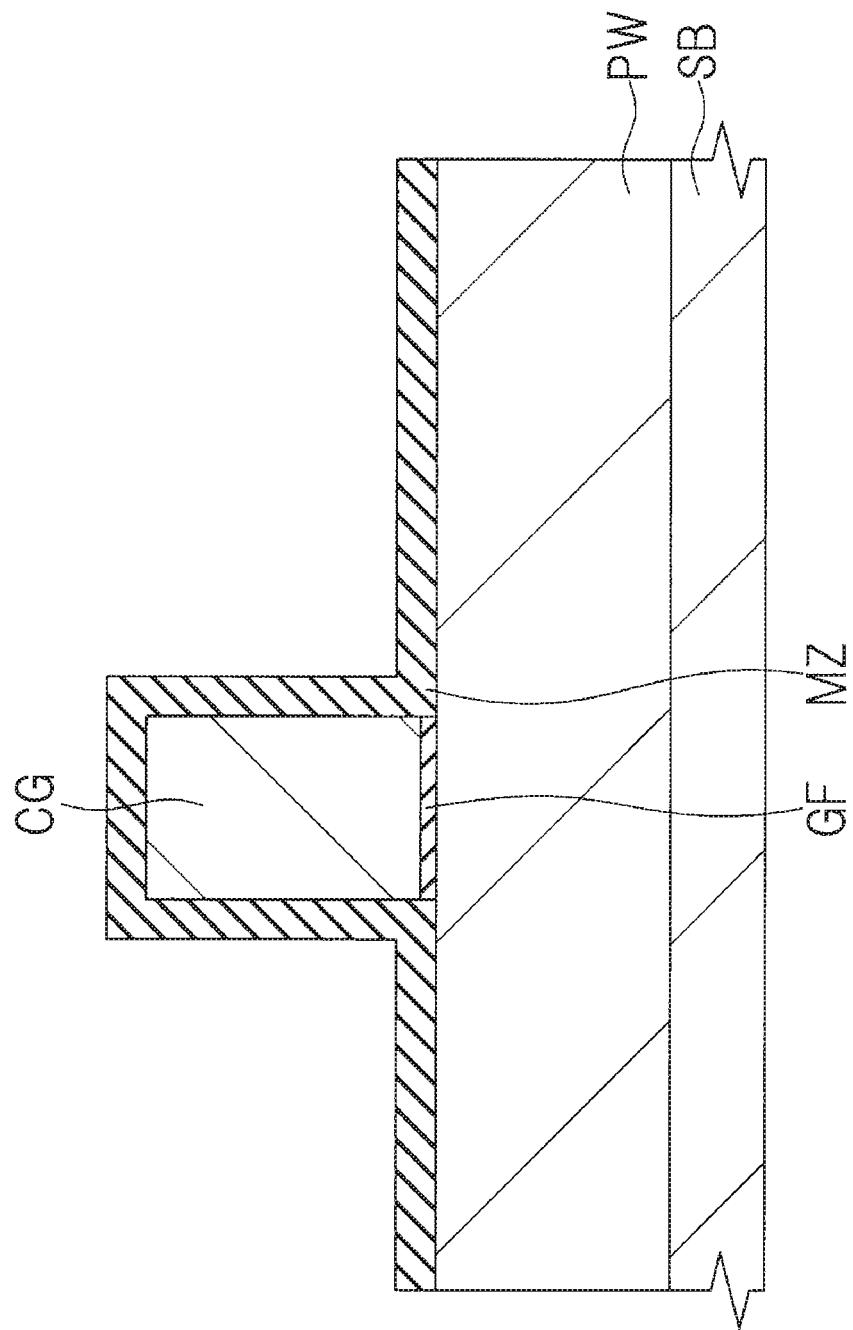
FIG. 21 is a cross sectional view showing a manufacturing process following FIG. 22.

FIG. 21 shows a step of forming a gate dielectric film MZ.

The insulating film MZ is formed on the well region PW and on the upper surface and side surfaces of the control gate electrode CG. As described above, the gate dielectric film MZ includes the insulating film BT, the insulating film HSO1, the insertion layer AL1, the insulating film HSO2, and the insulating film TP, and the methods of forming these insulating films are the same as those of the first embodiment.

Figure 22:
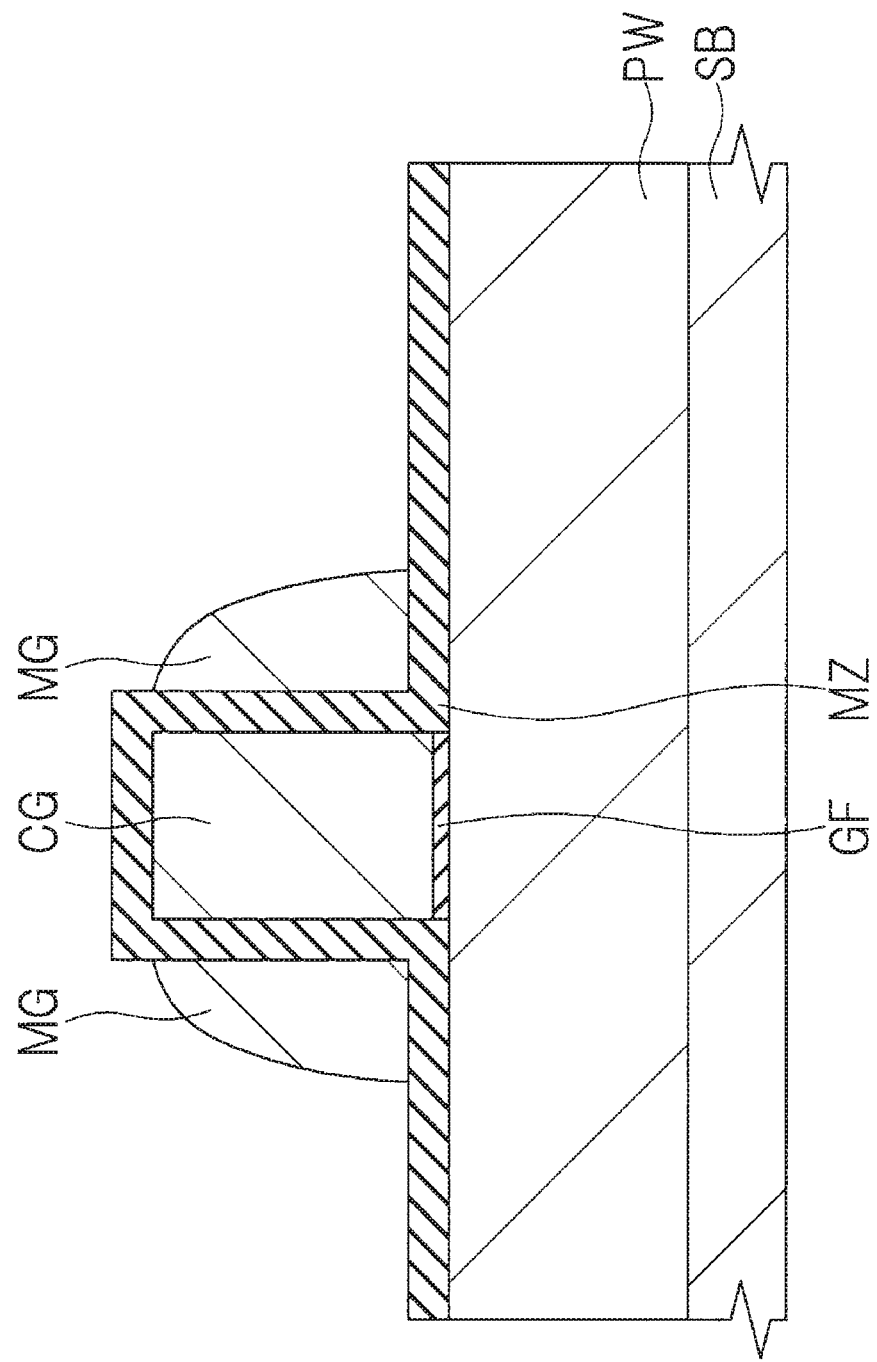
FIG. 22 is a cross sectional view showing a manufacturing process following FIG. 21.

FIG. 22 shows a step of forming a memory gate electrode MG.

First, a conductive film made of, e.g., polycrystalline silicon is deposited on the gate dielectric film MZ by, e.g., a CVD method. The conductive film may be, for example, a metal film such as a titanium nitride film, an aluminum film, or a tungsten film, or a stacked film of these metal films. Next, anisotropic etching is performed to process the conductive film into a sidewall shape, whereby the memory gate electrode MG formed of the conductive film is formed on both side surfaces of the control gate electrode CG via the gate dielectric film MZ.

Figure 23:
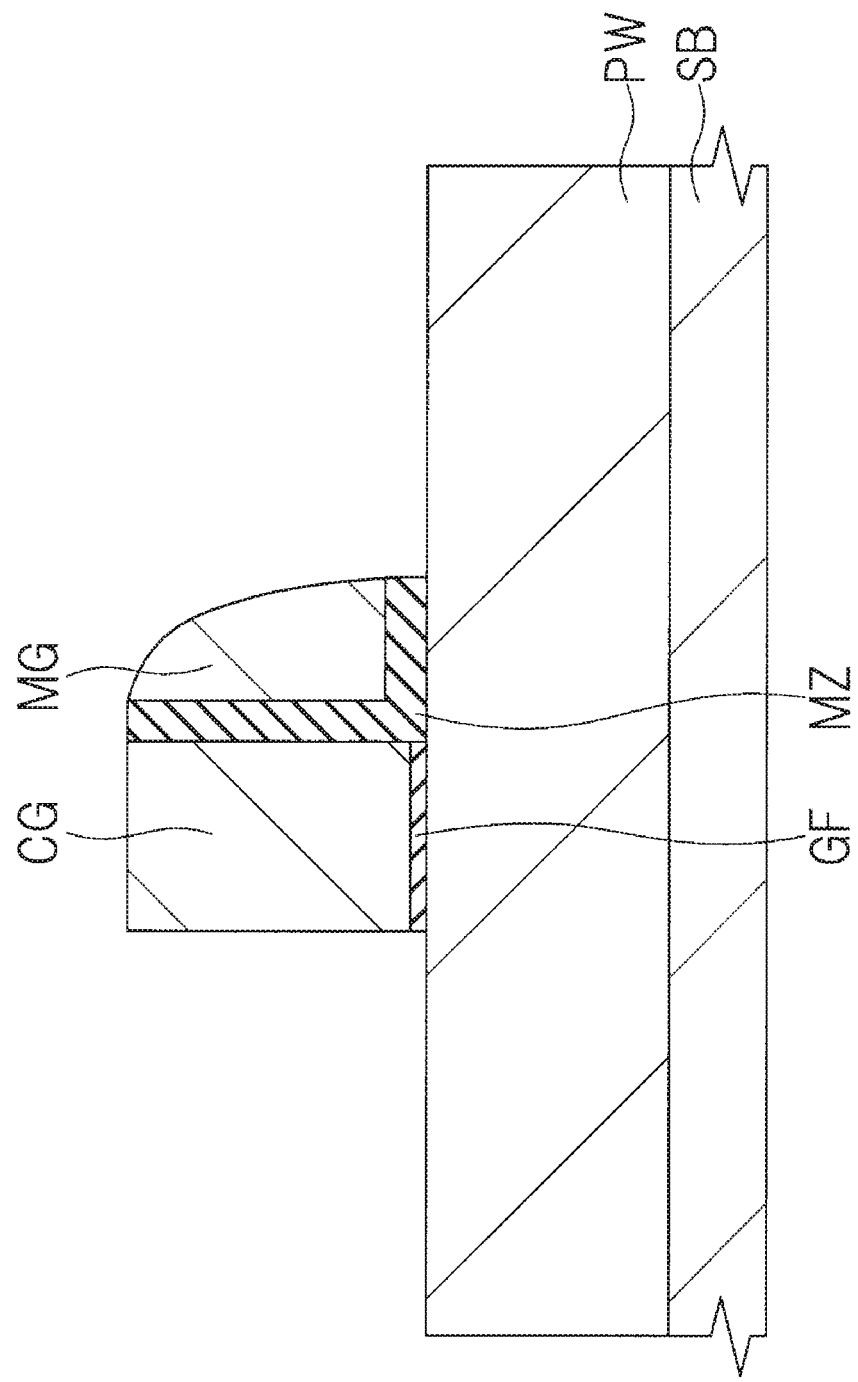
FIG. 23 is a cross sectional view showing a manufacturing process following FIG. 22.

FIG. 23 shows a step of removing a part of the gate dielectric film MZ and a part of the memory gate electrode MG.

First, a resist pattern is formed to cover the memory gate electrode MG formed on one side surface of the control gate electrode CG. Next, dry etching and wet etching are performed using the resist pattern as a mask to remove the gate dielectric film MZ and the memory gate electrode MG not covered by the resist pattern. As a result, the gate dielectric film MZ and the memory gate electrode MG on the drain region side of the memory cell MC2 are removed, and the gate dielectric film MZ and the memory gate electrode MG on the source region side of the memory cell MC2 are left.

Figure 24:
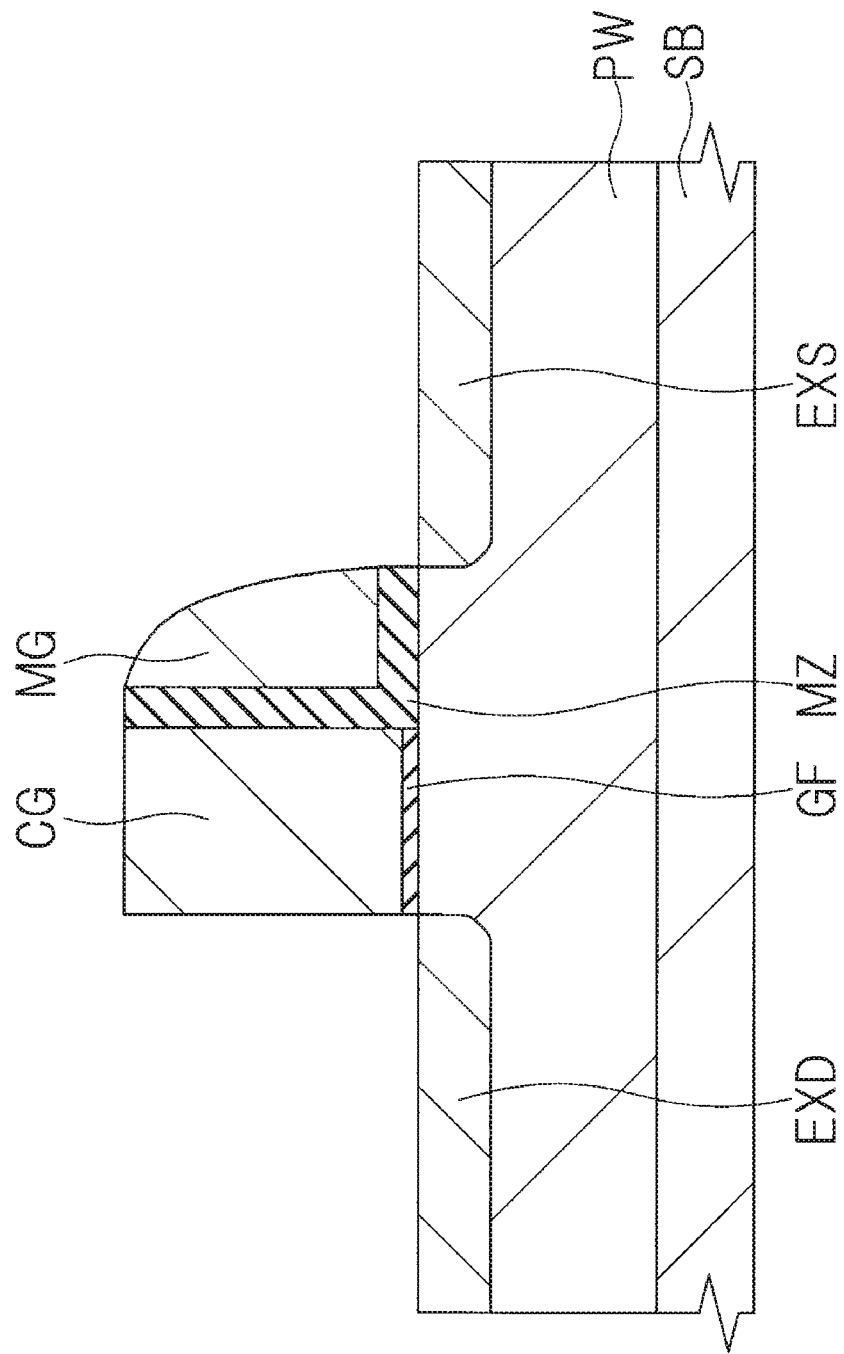
FIG. 24 is a cross sectional view showing a manufacturing process following FIG. 23.

FIG. 24 shows a step of forming an extension region EXD and an extension region EXS.

The n-type extension region EXD and the n-type extension region EXS are formed by introducing arsenic (As) or phosphorus (P), for example, into the well region PW by a photolithography method and an ion implantation method. The extension region EXD and the extension region EXS are formed in self-alignment with the control gate electrode CG and the memory gate electrode MG.

Figure 25:
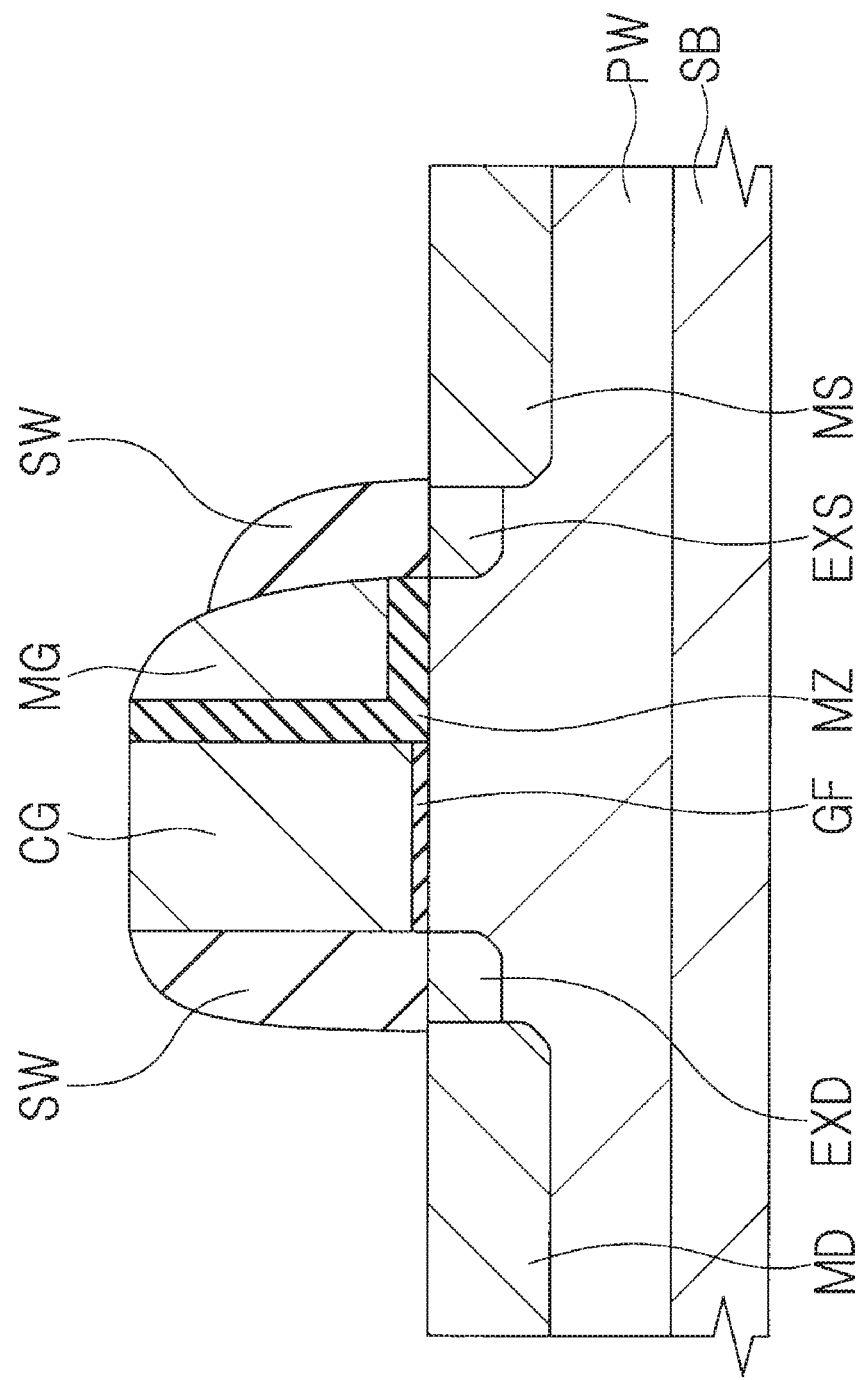
FIG. 25 is a cross sectional view showing a manufacturing process following FIG. 24.

FIG. 25 shows a step of forming sidewall spacers SW, a diffusion region MD, and a diffusion region MS.

First, an insulating film made of, e.g., silicon nitride is formed by, e.g., a CVD method so as to cover the memory cell MC. Next, anisotropic dry etching is performed on the insulating film to form the sidewall spacers SW on the side surface of the control gate electrode CG and the memory gate electrode MG. Note that the insulating film forming the sidewall spacers SW may be a silicon oxide film and a silicon nitride film formed on the silicon oxide film.

Next, by a photolithography method and an ion implantation method, arsenic (As) or phosphorus (P), for example, is introduced into the well region PW using the sidewall spacers SW as a mask, thereby forming the n-type diffusion region MD and the n-type diffusion region MS.

Thereafter, silicide layers SI are formed on the memory gate electrode MG, the control gate electrode CG, the diffusion region MS, and the diffusion region MD in the same manner as in the first embodiment, whereby the memory cell MC2 shown in FIG. 17 is manufactured.

Also, the second embodiment and the third embodiment technologies can be combined and applied to the memory cell MC2 of the fourth embodiment.

Modification

A semiconductor device of the modification of the fourth embodiment will be described below with reference to FIG. 26. In the following explanation, differences from the fourth embodiment will be mainly explained.

A memory cell MC3 of the present modification is a split-gate type memory cell having a memory gate electrode MG and a control gate electrode CG, similarly to the memory cell MC2 of the fourth embodiment. In the fourth embodiment, the gate dielectric film GF and the control gate electrode CG are formed first, and then the gate dielectric film MZ and the memory gate electrode MG are formed, but in the present modification, the order of forming these is reversed.

Hereinafter, a semiconductor device including the memory cell MC3 of the present modification will be described with reference to FIG. 26.

Figure 26:
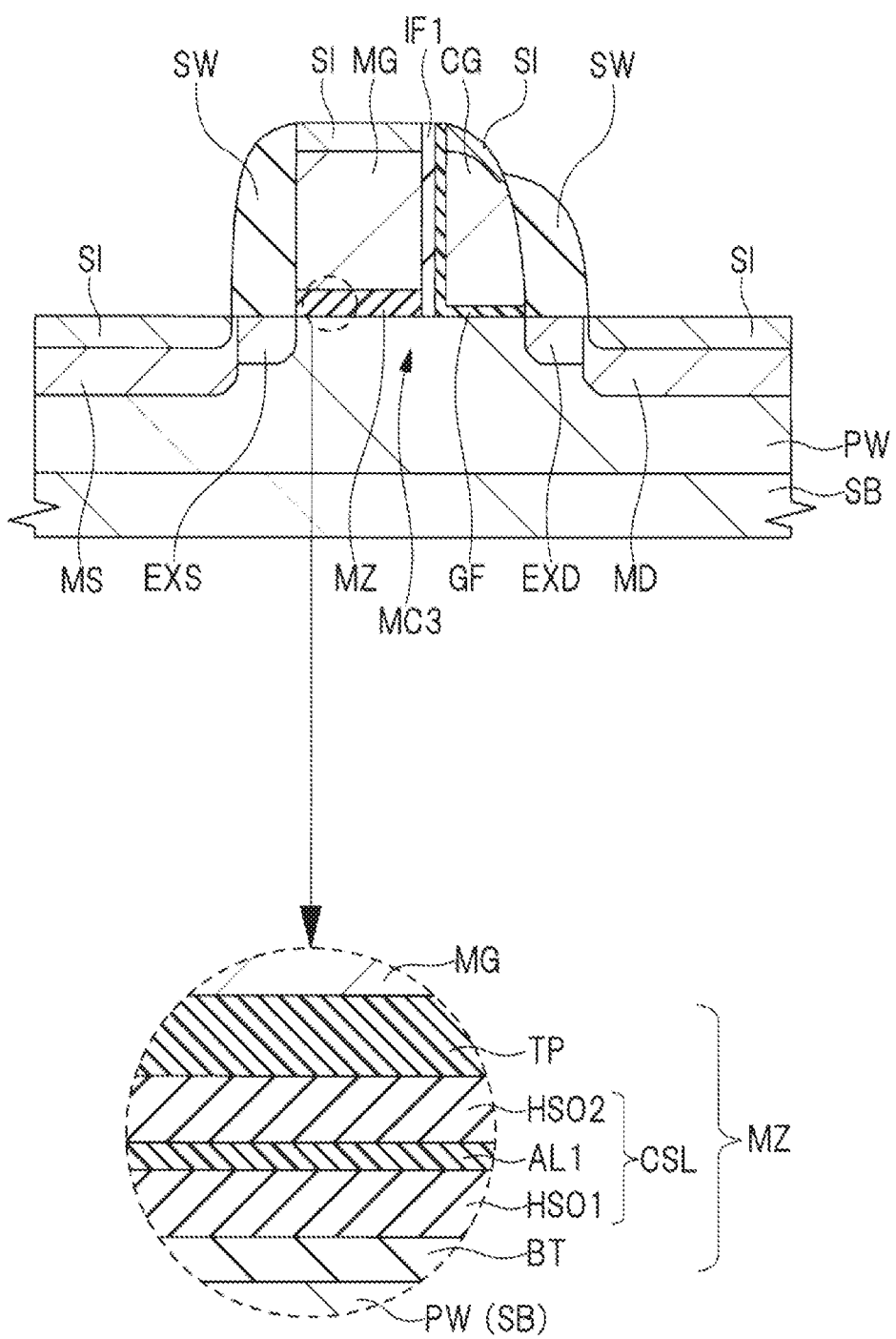
FIG. 26 is a cross sectional view showing a semiconductor device of modification.

As shown in FIG. 26, the gate dielectric film MZ is formed on the well region PW (semiconductor substrate SB), and the memory gate electrode MG is formed on the gate dielectric film MZ. An insulating film IF1 is formed on one side surface of the memory gate electrode MG. The insulating film IF1 is made of, for example, silicon nitride or silicon oxide. The gate dielectric film GF is formed on the well region PW and the insulating film IF1. When the insulating film IF1 is a silicon nitride film, as shown in FIG. 26, the gate dielectric film GF formed by an ISSG oxide method is also formed on the insulating film IF1. When the insulating film IF1 is a silicon oxide film, the gate dielectric film GF is not formed on the insulating film IF1. When the gate dielectric film GF is formed of a high dielectric constant film such as a hafnium oxide film by an ALD method, the gate dielectric film GF is also formed on the insulating film IF1 regardless of whether the insulating film IF1 is a silicon nitride film or a silicon oxide film.

On one side surface of the memory gate electrode MG, a control gate electrode CG is formed via the insulating film IF1 and the gate dielectric film GF. That is, at least an insulating film such as the insulating film IF1 is formed between the control gate electrode CG and the memory gate electrode MG, and the control gate electrode CG is insulated and separated from the memory gate electrode MG.

The structure and manufacturing method of each of the gate dielectric film MZ, the memory gate electrode MG, the gate dielectric film GF, and the control gate electrode CG are the same as those of the fourth embodiment.

Sidewall spacers SW are formed on the side surface of the control gate electrode CG opposite to the memory gate electrode MG, of the two side surfaces of the control gate electrode CG, and on the other side surface of the memory gate electrode MG. An extension region EXS, which is an n-type impurity region, is formed in the well region PW under the sidewall spacer SW on the memory gate electrode MG side, and an extension region EXD, which is an n-type impurity region, is formed in the well region PW under the sidewall spacer SW on the control gate electrode CG side. A diffusion region MS, which is an n-type impurity region, is formed in the well region PW at a position aligned the sidewall spacer SW on the memory gate electrode MG side, and a diffusion region MD, which is an n-type impurity region, is formed in the well region PW at a position aligned the sidewall spacer SW on the control gate electrode CG side. Silicide layers SI are formed on the memory gate electrode MG, the control gate electrode CG, the diffusion region MS, and the diffusion region MD.

Incidentally, the equivalent circuit diagram of the memory cell MC3 and the operating voltages of "write", "erase" and "read" are the same as those in FIGS. 18 and 19.

Also, in the present modification, the retention characteristics of the memory cell MC3 can be improved, and the reliability of the semiconductor device can be improved.

Although the invention made by the present inventors has been specifically described based on the embodiments, the present invention is not limited to the embodiments described above, and various modifications can be made without departing from the gist thereof.

For example, in the embodiments described above, the memory cells MC1 to MC3 are formed on the flat semiconductor substrate SB, but the memory cells MC1 to MC3 may be fin-structured. That is, the memory cells MC1 to MC3 may be provided by processing a part of the semiconductor substrate SB into a convex shape to form a protruding portion, and forming the gate dielectric film MZ so as to cover the upper surface and the side surface of the protruding portion.

What is claimed is:

1. A semiconductor device, comprising:
   a nonvolatile memory cell having:
      a first gate dielectric film formed on a semiconductor substrate and including a charge storage layer capable of holding charges; and
      a first gate electrode formed on the first gate dielectric film, wherein the charge storage layer includes:
      a first insulating film formed on the semiconductor substrate, the first insulating film being made of a hafnium silicate film,
      a first insertion layer formed on the first insulating film, the first insertion layer being made of an aluminum film, an aluminum nitride film, an aluminum carbide film, an aluminum silicate film, or an aluminum oxide film, and
      a second insulating film formed on the first insertion layer, the second insulating film being made of the hafnium silicate film.

2. The semiconductor device according to claim 1, wherein a thickness of the first insertion layer is smaller than a thickness of the first insulating film and a thickness of the second insulating film.

3. The semiconductor device according to claim 1,
   wherein the first gate dielectric film includes a third insulating film between the semiconductor substrate and the charge storage layer,
   wherein the third insulating film is made of a silicon oxide film or a silicon oxynitride film, and
   wherein the first insulating film is in direct contact with the third insulating film.

4. The semiconductor device according to claim 3, wherein the charge storage layer includes:
   a second insertion layer formed on the second insulating film, the second insertion layer being made of a same film as the first insertion layer, and
   a fourth insulating film formed on the second insertion layer, the fourth insulating film being made of the hafnium silicate film.

5. The semiconductor device according to claim 1,
   wherein the first gate dielectric film includes a third insulating film between the charge storage layer and the first gate electrode,
   wherein the third insulating film is made of the aluminum oxide film, an aluminum oxynitride film, or the aluminum silicate film, and
   wherein the third insulating film has a thickness greater than a thickness of the first insertion layer.

6. The semiconductor device according to claim 1,
   wherein the first gate dielectric film includes a third insulating film between the charge storage layer and the first gate electrode,
   wherein the third insulating film includes:
      a fourth insulating film formed on the charge storage layer, the fourth insulating film being made of the aluminum oxide film, an aluminum oxynitride film, or the aluminum silicate film,
      a fifth insulating film formed on the fourth insulating film, the fifth insulating film being made of a silicon oxide film, a silicon oxynitride film, or a silicon nitride film, and
      a sixth insulating film formed on the fifth insulating film, the sixth insulating film being made of the aluminum oxide film, the aluminum oxynitride film, or the aluminum silicate film, and
   wherein a thickness of the first insertion layer is smaller than a thickness of the fourth insulating film and a thickness of the sixth insulating film.

7. The semiconductor device according to claim 6, wherein the fourth insulating film including a plurality of first crystal grains and the sixth insulating film including a plurality of second crystal grains are separated by the fifth insulating film.

8. The semiconductor device according to claim 7,
   wherein the fourth insulating film is a first polycrystalline film,
   wherein the sixth insulating film is a second polycrystalline film, and
   wherein the fifth insulating film is an amorphous film.

9. The semiconductor device according to claim 1,
   wherein the nonvolatile memory cell includes:
      a second gate dielectric film formed on the semiconductor substrate, and
      a second gate electrode formed on the second gate dielectric film, and
   wherein the first gate electrode is insulated and separated from the second gate electrode.

10. The semiconductor device according to claim 1, wherein the first insertion layer is the aluminum oxide film.

11. A method of manufacturing a semiconductor device, the method comprising:
   (a) forming a first gate dielectric film on a semiconductor substrate, the first gate dielectric film including a charge storage layer capable of holding charges; and
   (b) forming a first gate electrode on the first gate dielectric film;
   wherein, in the (a), the forming the charge storage layer includes:
      (a1) forming a first insulating film on the semiconductor substrate, the first insulating film being a hafnium silicate film;
      (a2) forming a first insertion layer on the first insulating film, the first insertion layer being an aluminum film, an aluminum nitride film, an aluminum carbide film, an aluminum silicate film, or an aluminum oxide film; and
      (a3) forming a second insulating film on the first insertion layer, the second insulating film being the hafnium silicate film.

12. The method according to claim 11, comprising performing a heat treatment after the (a3),
   wherein the hafnium silicate film of each of the first insulating film and the second insulating film is a $Hf_xSi_{1-x}O_2$ ($0<x<1$) film,
   wherein a temperature of the heat treatment is set to 800° C. or more and less than 975° C. when $0.9 \leq x<1$, and
   wherein the temperature of the heat treatment is set to 975° C. or more and 1050° C. or less when $0<x<0.9$.

13. The method according to claim 11,
   wherein, in the (a), the forming the charge storage layer includes:
      (a4) forming a second insertion layer on the second insulating film, the second insertion layer having a thickness smaller than a thickness of the second insulating film, the second insertion layer being the aluminum film, the aluminum nitride film, the aluminum carbide film, the aluminum silicate film, or the aluminum oxide film; and
- (a5) forming a third insulating film on the second insertion layer, the third insulating film having a thickness greater than the thickness of the second insertion layer, the third insulating film being the hafnium silicate film, wherein a thickness of the first insertion layer is smaller than a thickness of the first insulating film, and wherein a thickness of the second insulating film is greater than the thickness of the first insertion layer.

\* \* \* \* \*